(12) United States Patent
Kim et al.

(10) Patent No.: US 11,818,937 B2
(45) Date of Patent: *Nov. 14, 2023

(54) ORGANIC LIGHT EMITTING DISPLAY

(71) Applicant: Samsung Display Co., Ltd., Yongin-si (KR)

(72) Inventors: Yo Han Kim, Seoul (KR); Yong Tack Kim, Yongin-si (KR); Yoon Hyeung Cho, Yongin-si (KR); Jong Jin Park, Cheonan-si (KR); Deok Chan Yoon, Hwaseong-si (KR); Yun Kyu Lee, Gumi-si (KR); Dong Uk Choi, Sejong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/543,483

(22) Filed: Dec. 6, 2021

(65) Prior Publication Data

US 2022/0093691 A1 Mar. 24, 2022

Related U.S. Application Data

(63) Continuation of application No. 16/706,559, filed on Dec. 6, 2019, now Pat. No. 11,195,884.

(30) Foreign Application Priority Data

Feb. 7, 2019 (KR) .................. 10-2019-0014470

(51) Int. Cl.
*H10K 59/38* (2023.01)
*H10K 50/13* (2023.01)
(Continued)

(52) U.S. Cl.
CPC .......... *H10K 59/38* (2023.02); *H10K 50/115* (2023.02); *H10K 50/13* (2023.02); *H10K 50/844* (2023.02);
(Continued)

(58) Field of Classification Search
CPC ...... H10K 59/38; H10K 50/115; H10K 50/13; H10K 50/844; H10K 50/846; H10K 59/12;
(Continued)

(56) References Cited

U.S. PATENT DOCUMENTS 10,720,607 B2 * 7/2020 Song ............... H10K 50/8445
2009/0261716 A1 * 10/2009 Choi ................. H10K 50/852
313/504

(Continued)

FOREIGN PATENT DOCUMENTS

CN 109148724 A 1/2019
EP 2731156 A2 5/2014
(Continued)

OTHER PUBLICATIONS

EPO Extended Search Report dated Jul. 30, 2020, for corresponding European Patent Application No. 20153798.2 (13 pages).

*Primary Examiner* — Mohammed Shamsuzzaman
(74) *Attorney, Agent, or Firm* — Lewis Roca Rothgerber Christie LLP

(57) ABSTRACT

An organic light emitting display is provided. The organic light emitting display includes a first base substrate; a plurality of organic light emitting diodes disposed on the first base substrate; an encapsulation layer disposed on the organic light emitting diodes; and a plurality of first color conversion filters disposed on the encapsulation layer. The encapsulation layer includes: a first sub-inorganic layer disposed on the organic light emitting diodes; a second
(Continued)

sub-inorganic layer disposed on the first sub-inorganic layer and having a refractive index different from that of the first sub-inorganic layer; an organic layer disposed on the second sub-inorganic layer; and a third sub-inorganic layer disposed on the organic layer.

20 Claims, 18 Drawing Sheets

(51) Int. Cl.
H10K 50/115 (2023.01)
H10K 50/844 (2023.01)
H10K 50/84 (2023.01)
H10K 59/12 (2023.01)
H10K 59/35 (2023.01)

(52) U.S. Cl.
CPC ........... *H10K 50/846* (2023.02); *H10K 59/12* (2023.02); *H10K 59/35* (2023.02)

(58) Field of Classification Search
CPC .... H10K 59/35; H10K 50/858; H10K 50/865; H10K 2102/351; H10K 50/84; Y10S 977/774
See application file for complete search history.

(56) References Cited

U.S. PATENT DOCUMENTS

| | | | |
|---|---|---|---|
| 2014/0034919 A1* | 2/2014 | Park | H10K 50/858 257/40 |
| 2014/0167006 A1* | 6/2014 | Kim | H10K 59/12 264/293 |
| 2015/0014663 A1* | 1/2015 | Kwak | H01L 21/02126 257/40 |
| 2016/0190519 A1 | 6/2016 | Cho | |
| 2017/0294493 A1* | 10/2017 | Yoo | H10K 50/844 |
| 2017/0309859 A1* | 10/2017 | Lee | H10K 50/86 |
| 2017/0357125 A1* | 12/2017 | Tojo | G02F 1/136 |
| 2018/0006274 A1* | 1/2018 | Kim | H10K 50/86 |
| 2018/0047800 A1* | 2/2018 | Choi | H10K 59/38 |
| 2018/0149872 A1* | 5/2018 | Choi | H10K 50/865 |
| 2019/0051711 A1* | 2/2019 | Lee | G09G 3/3208 |
| 2019/0121176 A1* | 4/2019 | Lee | G02F 1/133617 |
| 2020/0212140 A1* | 7/2020 | Huh | H10K 59/124 |
| 2020/0212147 A1* | 7/2020 | Han | H01L 25/50 |
| 2020/0227489 A1* | 7/2020 | Kim | H10K 59/122 |

FOREIGN PATENT DOCUMENTS

| | | |
|---|---|---|
| EP | 3236506 A1 | 10/2017 |
| EP | 3339920 A1 | 6/2018 |
| EP | 3557645 A1 | 10/2019 |
| TW | 201830611 A | 8/2018 |

* cited by examiner

ORGANIC LIGHT EMITTING DISPLAY

CROSS-REFERENCE TO RELATED APPLICATIONS

This application is a continuation of U.S. patent application Ser. No. 16/706,559, filed Dec. 6, 2019, which claims priority to and the benefit of Korean Patent Application No. 10-2019-0014470, filed Feb. 7, 2019, the entire content of both of which is incorporated herein by reference.

BACKGROUND

1. Field

The present disclosure relates to an organic light emitting display (OLED), and more particularly, to an OLED including quantum dot color conversion filters.

2. Description of the Related Art

With the development of multimedia, display devices are becoming increasingly important. Accordingly, various types (e.g., kinds) of display devices such as organic light emitting displays (OLEDs) and liquid crystal displays (LCDs) are being utilized.

Of the display devices, an OLED includes an organic light emitting diode which is a self-luminous element. The organic light emitting diode may include two electrodes facing each other and an organic light emitting layer interposed between the two electrodes. Electrons and holes provided from the two electrodes may be recombined in the organic light emitting layer to generate excitons. As the generated excitons change from an excited state to a ground state, light may be emitted.

Because OLEDs do not need a light source, they are low in power consumption, can be made lightweight and thin, and have a wide viewing angle, high luminance and contrast, and fast response speed. Due to these desirable (e.g., high-quality) characteristics, OLEDs are drawing attention as the next-generation display devices.

In addition, a quantum dot is a nano-sized semiconductor particle that is a few nanometers in size and has a quantum confinement effect. In a bulk state, the quantum dot exhibits suitable (e.g., excellent) optical and electrical properties that a general semiconductor material does not have. When stimulated with energy such as light, the quantum dot may emit light, and the color of the emitted light varies according to the size of the particle.

Utilizing quantum dots, it may be possible to implement large-area and high-resolution display devices with good color purity, suitable (e.g., excellent) color reproducibility and good moving-image characteristics. Accordingly, a lot of research is being conducted.

SUMMARY

Aspects of the present disclosure are directed toward an organic light emitting display (OLED) with improved luminance by matching refractive indices of elements disposed on an organic light emitting layer.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

According to an embodiment, an organic light emitting display includes a first base substrate; a plurality of organic light emitting diodes on the first base substrate; an encapsulation layer on the plurality of organic light emitting diodes; and a plurality of first color conversion filters on the encapsulation layer, wherein the encapsulation layer includes a first sub-inorganic layer on the organic light emitting diodes; a second sub-inorganic layer on the first sub-inorganic layer and having a refractive index different from a refractive index of the first sub-inorganic layer (e.g., the second sub-inorganic layer different in refractive index from that of the first sub-inorganic layer); an organic layer on the second sub-inorganic layer; and a third sub-inorganic layer on the organic layer.

According to an embodiment, an organic light emitting display includes a plurality of color areas and a non-light emitting area. The organic light emitting display includes a plurality of organic light emitting diodes in the plurality of color areas, respectively; an encapsulation layer on the organic light emitting diodes; and a wavelength conversion pattern on the encapsulation layer and in at least one of the plurality of the color areas, wherein the encapsulation layer includes a first inorganic layer on the organic light emitting diodes; an organic layer on the first inorganic layer; and a second inorganic layer on the organic layer, wherein the first inorganic layer includes a first sub-inorganic layer and a second sub-inorganic layer having a refractive index greater than a refractive index of the first sub-inorganic layer, and the second inorganic layer includes a third sub-inorganic layer and a fourth sub-inorganic layer having a refractive index greater than a refractive index of the third sub-inorganic layer.

BRIEF DESCRIPTION OF THE DRAWINGS

The above and other aspects of the present disclosure will become apparent and more readily appreciated from the following description of the embodiments, taken in conjunction with the accompanying drawings, in which.

DETAILED DESCRIPTION

Figure 1:
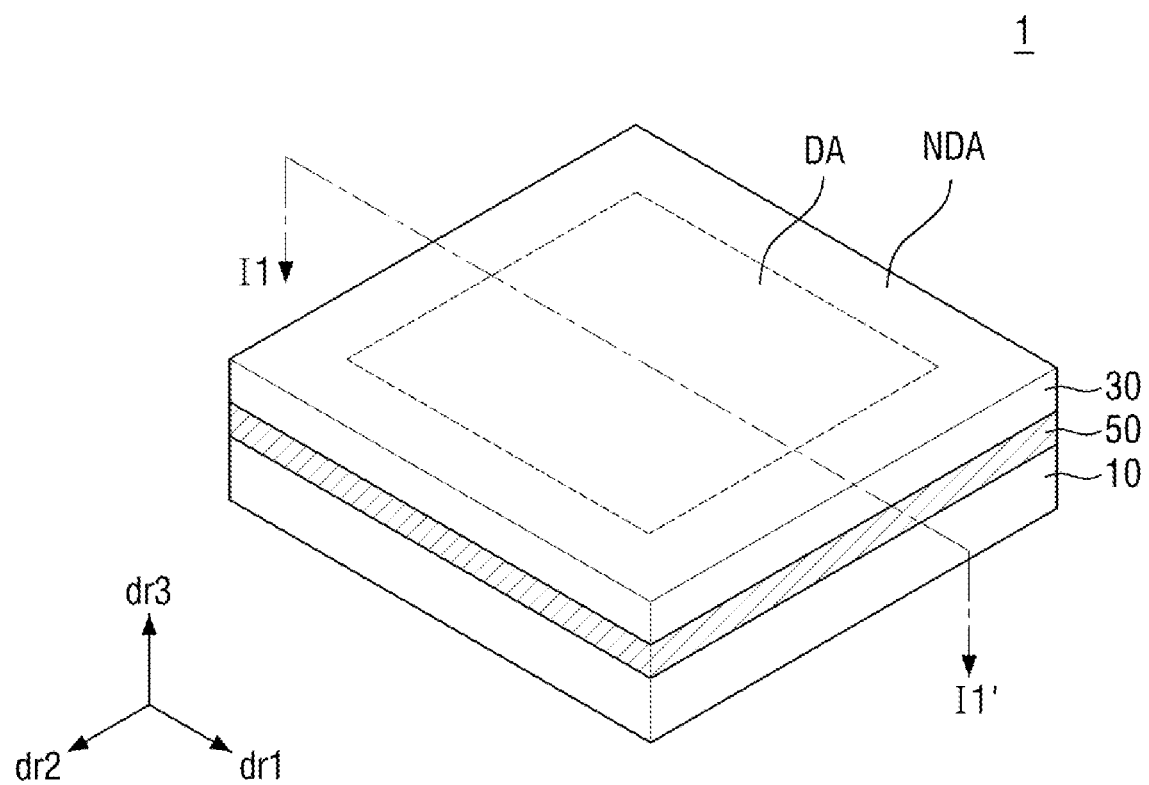
FIG. 1 is a perspective view of an organic light emitting display (OLED) according to an embodiment.

Features of the current disclosure and methods of accomplishing the same may be understood more readily by reference to the following detailed description of embodiments and the accompanying drawings. The subject matter of the current disclosure may, however, be embodied in many different forms and should not be construed as being limited to the embodiments set forth herein. Rather, these embodiments are provided so that this disclosure will be thorough and complete and will fully convey the concept of the subject matter of the current disclosure to those skilled in the art, and the subject matter of current disclosure will only be defined by the appended claims, and equivalents thereof. Like reference numerals refer to like elements throughout the specification.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the current disclosure.

The terminology used herein is for the purpose of describing particular embodiments only and is not intended to be limiting of the subject matter of the current disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups, but do not preclude the presence or addition of one or more other features, integers, steps, operations, elements, components, and/or groups thereof.

Organic light emitting displays (OLED) according to various embodiments of the present disclosure are devices for displaying moving images and/or still images and/or devices for displaying stereoscopic images. The OLEDs may be utilized as display screens of portable electronic devices such as mobile communication terminals, smartphones, tablet computers, smart watches and/or navigation systems, as well as display screens of various products such as televisions, notebooks, monitors, billboards and/or the Internet of things. However, embodiments of the present disclosure are not limited thereto, and the OLEDs can also be utilized as display screens of other electronic devices without departing from the spirit of the present disclosure.

Hereinafter, embodiments of the present disclosure will be described in more detail with reference to the accompanying drawings. The same or similar reference numerals will be utilized for the same elements in the drawings.

Figure 2:
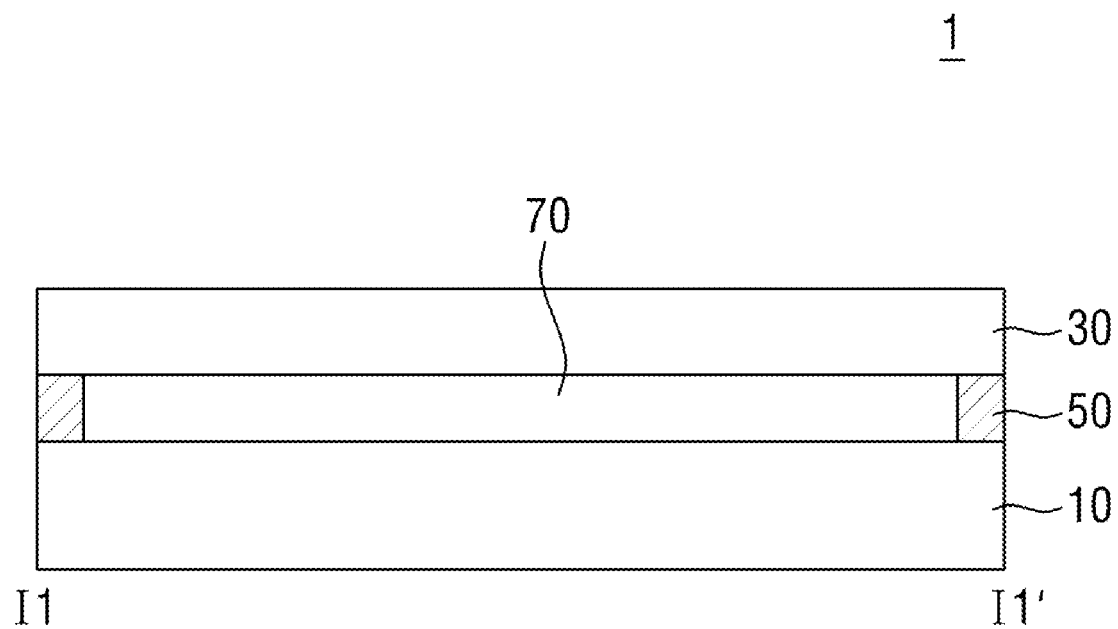
FIG. 2 is a schematic cross-sectional view of the OLED taken along the line I1-I1' of FIG. 1.
Figure 3:
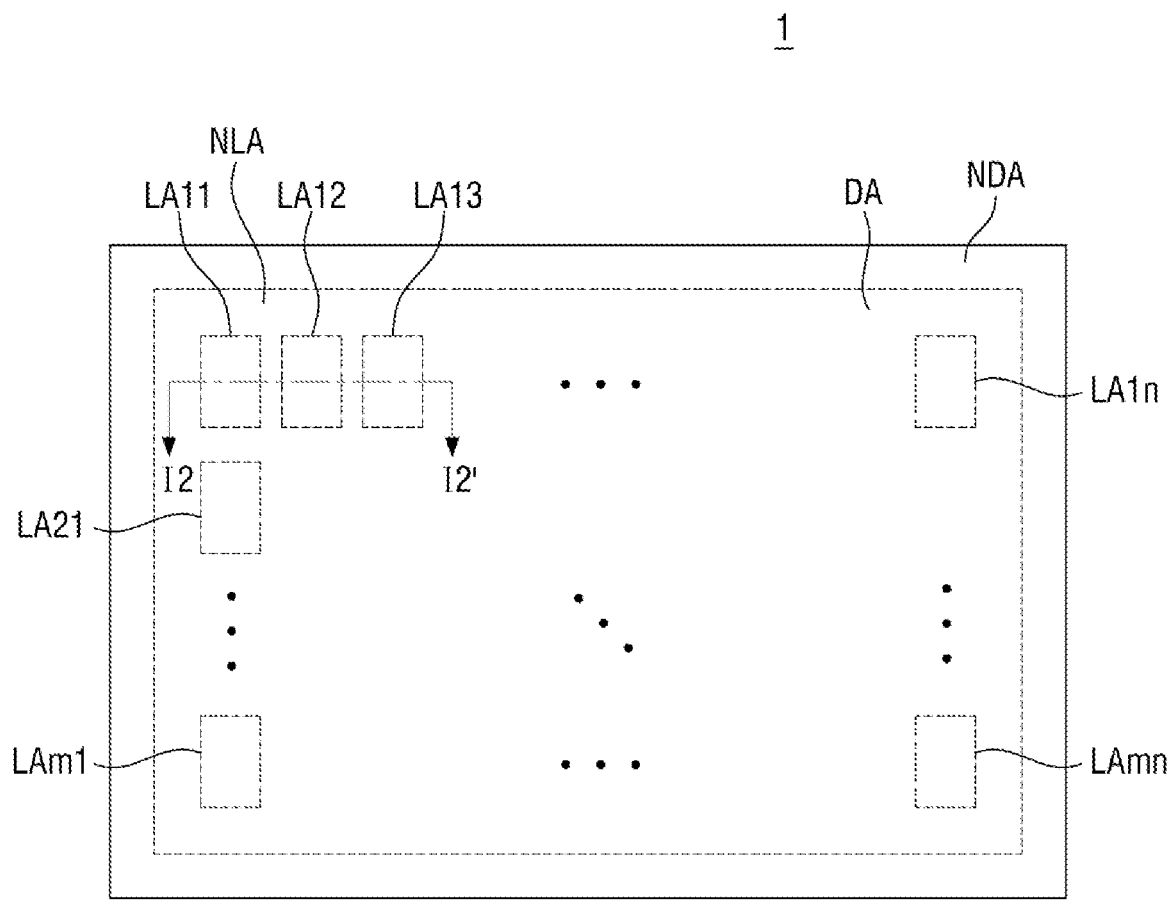
FIG. 3 is a schematic plan view of the OLED according to the embodiment.
Figure 3:
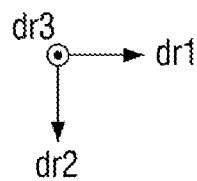

FIG. 1 is a perspective view of an OLED 1 according to an embodiment. FIG. 2 is a schematic cross-sectional view of the OLED 1 taken along the line I1-I1' of FIG. 1. FIG. 3 is a schematic plan view of the OLED 1 according to the embodiment.

Referring to FIGS. 1-3, the OLED 1 includes a display area DA and a non-display area NDA.

The display area DA is defined as an area that displays an image. Elements for displaying images may be disposed in the display area DA.

In an embodiment, the display area DA may have a flat shape. The display area DA may be disposed in a central part of the OLED 1. However, the position and shape of the display area DA are not limited to those illustrated in the drawings. In an embodiment, the display area DA may be disposed at edges of the OLED 1, and/or at least a part of the display area DA may be bent.

The display area DA includes a light emitting area and a non-light emitting area NLA.

The light emitting area is defined as a part of the display area DA through which light is transmitted and viewed by a user. The light emitting area may include a plurality of color areas LA11 through LAmn. The color areas LA11 through LAmn may be arranged in (e.g., in the shape of) a matrix. For example, the color areas LA11 through LAmn may be arranged in an n×m matrix. As exemplary color areas, a first color area LA11 in a first row and a first column, a second color area LA12 in the first row and a second column, and a third color area LA13 in the first row and a third column will be described below.

The color areas LA11 through LAmn may include red light emitting areas, green light emitting areas, and blue light emitting areas. In some embodiments, white light emitting areas may be further provided. In an embodiment, the color areas LA11 through LAmn may include cyan, magenta and yellow light emitting areas instead of the red light emitting areas, the green light emitting areas and the blue light emitting areas. A case where the light emitting area of the OLED1 includes the first color area LA11, the second color area LA12 and the third color area LA13, which emit red light, green light and blue light, respectively, will be described below as an example. However, the color (e.g., color types) and arrangement order of the first color area LA11, the second color area LA12, and the third color area LA13 are not limited to this example.

In the present specification, blue light refers to light having a wavelength range of about 450 ☐ to about 495 ☐, green light refers to light having a wavelength range of about 495 ☐ to about 570 ☐, and red light refers to light having a wavelength range of about 620 ☐ to about 750 ☐.

The first color area LA11, the second color area LA12, and the third color area LA13 may be alternately arranged along a column direction and/or a row direction. Each of the first color area LA11, the second color area LA12 and the third color area LA13 may have a quadrilateral shape.

The row direction, as used herein, denotes a first direction dr1, which is a horizontal direction in the drawings. The column direction, as used herein, denotes a second direction dr2, which is a vertical direction in the drawings. The row direction and the column direction are directions crossing (e.g., intersecting) each other. That is, the first direction dr1 is a direction crossing (e.g., intersecting) the second direction dr2. In addition, a third direction dr3 denotes a direction perpendicular to or crossing the second direction dr2 and the first direction dr1. That is, the third direction dr3 is a thickness direction of the OLED 1 (e.g., a thickness direction of a first substrate 10). However, embodiments are not limited to the directions mentioned above, and it should be understood that one of the first direction dr1, the second direction dr2 and the third direction dr3 is a direction (e.g., relative direction) perpendicular to or crossing all of the other directions.

In one embodiment, the color areas LA11 through LAmn may have different sizes. In this case, the third color area LA13 may be larger than the first color area LA11, and the first color area LA11 may be larger than the second color area LA12. However, the order of the sizes of the first through third color areas LA11 through LA13 is not limited to this example.

The non-light emitting area NLA is defined as an area for separating the color areas LA11 through LAmn in the display area DA. That is, the non-light emitting area NLA may be an area through which light is not transmitted. The non-light emitting area NLA may surround each of the color areas LA11 through LAmn. For example, the non-light emitting area NLA may be in a net shape.

The non-display area NDA is defined as an area where no image is displayed. The non-display area NDA is disposed on at least one side of the display area DA. For example, the non-display area NDA may surround the display area DA. In an embodiment, a speaker module and a sensor module may be disposed in the non-display area NDA. In an embodiment, the sensor module may include at least one of a remote control sensor, an illuminance sensor, a proximity sensor, an infrared sensor, and/or an ultrasonic sensor.

The OLED 1 may have a stacked structure including, for example, the first substrate 10, a second substrate 30 facing the first substrate 10, a filling layer 70 interposed between the first substrate 10 and the second substrate 30, and a sealing portion 50 bonding the first substrate 10 and the second substrate 30 together at edges of the filling layer 70.

The first substrate 10 may include elements and circuits for displaying an image, for example, pixel circuits (such as switching elements) and organic light emitting diodes. The first substrate 10 may be a display substrate.

The second substrate 30 may be located above the first substrate 10 and face the first substrate 10. The second substrate 30 may be, but is not limited to, a color conversion substrate including a color conversion filter that converts the color of light emitted from the first substrate 10.

The sealing portion 50 may be located between the first substrate 10 and the second substrate 30. The sealing portion 50 may be disposed in the non-display area NDA along edges of the first substrate 10 and the second substrate 30. The first substrate 10 and the second substrate 30 may be bonded together by the sealing portion 50. The sealing portion 50 may include, but is not limited to, an organic material such as epoxy resin.

The filling layer 70 may be located in a space between the first substrate 10 and the second substrate 30 and be surrounded by the sealing portion 50. The filling layer 70 may fill the space between the first substrate 10 and the second substrate 30. The filling layer 70 may be made of a material that can transmit light. For example, the filling layer 70 may include a silicon-based organic material, an epoxy-based organic material, an epoxy-acrylic-based organic material, and/or another suitable organic material (e.g., organic matter). In some embodiments, the filling layer 70 may be a silicone rubber or an air layer. Here, the air layer may contain an inert gas (such as nitrogen or argon) or may contain various kinds of gas mixtures.

The stacked structure of the OLED 1 will now be described in more detail with reference to FIGS. 4 and 5. The following description will be given based on the first color area LA11, the second color area LA12 and the third color area LA13, which are exemplary color areas included in the light emitting area.

Figure 4:
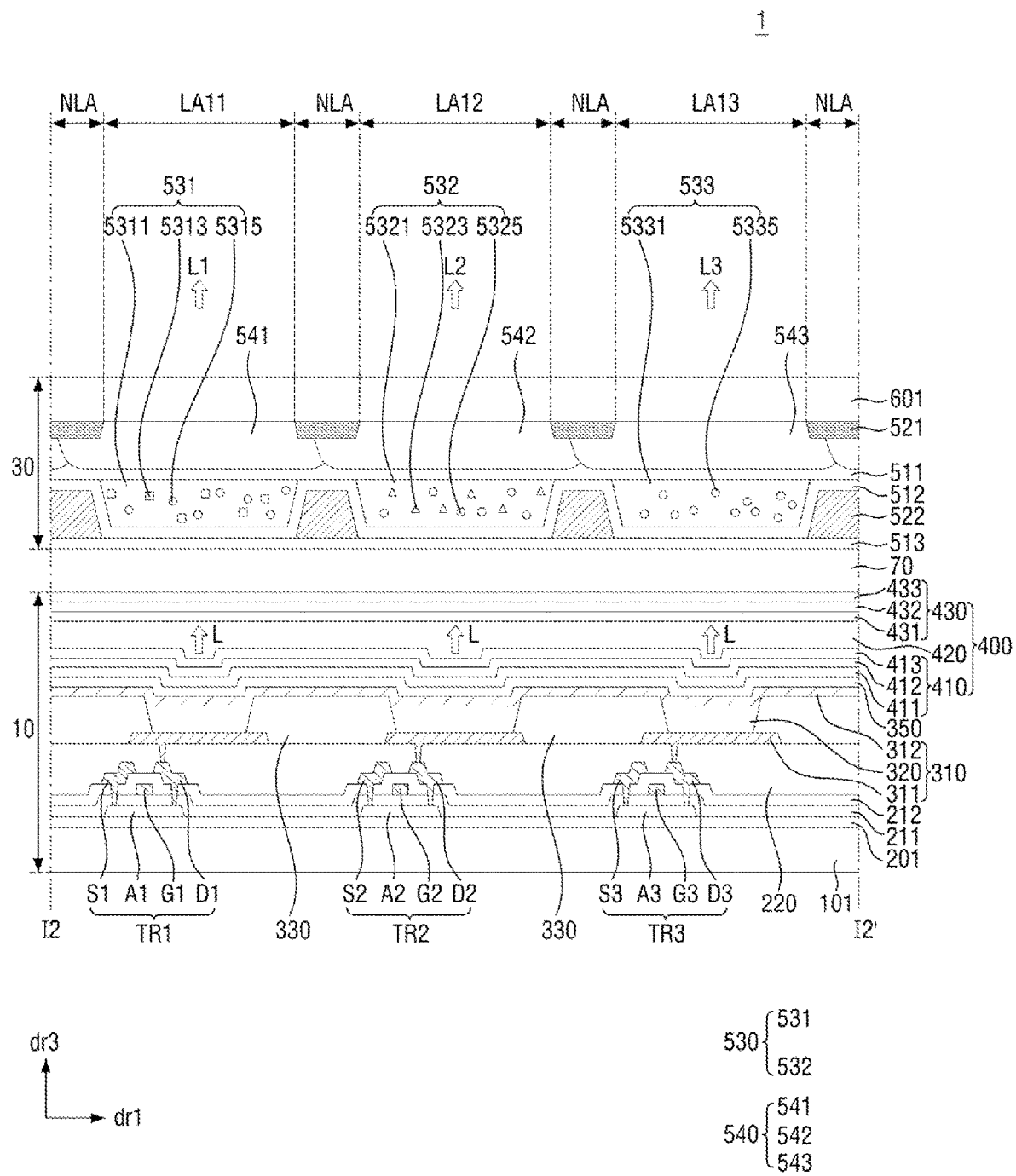
FIG. 4 is a cross-sectional view of the OLED taken along the line I2-I2' of FIG. 3.

FIG. 4 is a cross-sectional view of the OLED 1 taken along the line I2-I2' of FIG. 3. FIG. 5 is an enlarged cross-sectional view of an organic light emitting diode 310 illustrated in FIG. 4.

The first substrate 10 will now be described in more detail.

The first substrate 10 includes a first base substrate 101, a plurality of switching elements TR1 through TR3 disposed on the first base substrate 101, a plurality of organic light emitting diodes 310 disposed on the switching elements TR1 through TR3, and an encapsulation layer 400 disposed on the organic light emitting diodes 310.

The display area DA and the non-display area NDA described above may be defined in the first substrate 10.

The first base substrate 101 may be a rigid substrate. Here, the first base substrate 101 may be one selected from a glass substrate, a quartz substrate, a glass ceramic substrate, a crystalline glass substrate, and reinforced plastic.

A buffer layer 201 is disposed on the first base substrate 101. The buffer layer 201 functions to smooth the surface of the first base substrate 101 and to prevent or reduce introduction of moisture and/or outside air. The buffer layer 201 may be an inorganic layer. The buffer layer 201 may be a single layer or a multilayer.

The switching elements TR1 through TR3 are disposed on the buffer layer 201. Each of the switching elements TR1 through TR3 may be a thin-film transistor. Each of the switching elements TR1 through TR3 illustrated in the drawings may be a driving thin-film transistor.

The switching elements TR1 through TR3 may include a first switching element TR1, a second switching element TR2, and a third switching element TR3. One or more switching elements TR1, TR2 or TR3 may be provided in each of the color areas LA11 through LA13. For example, the first switching element TR1 may be provided in the first color area LA11, the second switching element TR2 may be provided in the second color area LA12, and the third switching element TR3 may be provided in the third color area LA13.

The switching elements TR1 through TR3 may include semiconductor layers A1 through A3, gate electrodes G1 through G3, source electrodes S1 through S3, and drain electrodes D1 through D3, respectively. For example, the semiconductor layers A1 through A3 are disposed on the buffer layer 201. The semiconductor layers A1 through A3 may include amorphous silicon, polysilicon, low-temperature polysilicon, and/or an organic semiconductor. In an embodiment, the semiconductor layers A1 through A3 may be oxide semiconductors. In one embodiment, each of the semiconductor layers A1 through A3 may include a channel region and a source region, and a drain region disposed on both sides of the channel region and doped with impurities.

A gate insulating layer 211 is disposed on the semiconductor layers A1 through A3. The gate insulating layer 211 may be an inorganic layer. The gate insulating layer 211 may be a single layer or a multilayer.

The gate electrodes G1 through G3 are disposed on the gate insulating layer 211. The gate electrodes G1 through G3 may be made of a metal material having conductivity. For example, the gate electrodes G1 through G3 may include molybdenum (Mo), aluminum (Al), copper (Cu), and/or titanium (Ti). Each of the gate electrodes G1 through G3 may be a single layer or a multilayer.

A first interlayer insulating layer 212 is disposed on the gate electrodes G1 through G3. The first interlayer insulating layer 212 may be an inorganic layer. The first interlayer insulating layer 212 may be a single layer or a multilayer.

The source electrodes S1 through S3 and the drain electrodes D1 through D3 are disposed on the first interlayer insulating layer 212. The source electrodes S1 through S3 and the drain electrodes D1 through D3 are made of a metal material having conductivity. For example, the source electrodes S1 through S3 and the drain electrodes D1 through D3 may include aluminum (Al), copper (Cu), titanium (Ti), and/or molybdenum (Mo).

The source electrodes S1 through S3 and the drain electrodes D1 through D3 may respectively be electrically connected to the source regions and the drain regions of the semiconductor layers A1 through A3 through contact holes passing through the first interlayer insulating layer 212 and the gate insulating layer 211.

In one embodiment, the OLED 1 may further include storage capacitors and switch transistors on the first base substrate 101.

A protective layer 220 is disposed on the source electrodes S1 through S3, the drain electrodes D1 through D3, and the first interlayer insulating layer 212. Here, the protective layer 220 covers a circuit unit including the switching elements TR1 through TR3. The protective layer 220 may be a passivation layer or a planarization layer. The passivation layer may include $SiO_2$, $SiN_x$ and/or the like, and the planarization layer may include a material such as acrylic and/or polyimide. The protective layer 220 may also include both the passivation layer and the planarization layer. In this case, the passivation layer may be disposed on the source electrodes S1 through S3, the drain electrodes D1 through D3 and the first interlayer insulating layer 212, and the planarization layer may be disposed on the passivation layer. An upper surface of the protective layer 220 may be flat.

The organic light emitting diodes 310 may be disposed on the protective layer 220. The organic light emitting diodes 310 may be disposed in the color areas LA11 through LA13, respectively. Elements of each organic light emitting diode 310 will now be described in more detail.

A plurality of first pixel electrodes 311 may be disposed on the protective layer 220. The first pixel electrodes 311 may be pixel electrodes disposed in the color areas LA11 through LA13, respectively. In addition, the first pixel electrodes 311 may be anodes of the organic light emitting diodes 310.

The first pixel electrodes 311 may be electrically connected to the drain electrodes D1 through D3 (or the source electrodes S1 through S3) disposed on the first base substrate 101 through via holes passing through the protective layer 220, respectively.

The first pixel electrodes 311 may include a material having a high work function. The first pixel electrodes 311 may include indium-tin-oxide (ITO), indium-zinc-oxide (IZO), zinc oxide (ZnO), and/or indium oxide ($In_2O_3$).

In an embodiment, the areas occupied respectively by the first pixel electrodes 311 in the color areas LA11 through LA13 in a plan view may be the same. That is, the first pixel electrodes in the color areas LA11 through LA 13 may have the same surface area in a plan view.

A pixel defining layer 330 is disposed on the first pixel electrodes 311. The pixel defining layer 330 includes openings at least partially exposing the respective first pixel electrodes 311. In an embodiment, the openings may have different widths in the color areas LA11 through LA13. For example, the openings may have smaller (e.g., decreasing) widths in the order of the opening of the second color area LA12, the opening of the first color area LA11, and the opening of the third color area LA13. That is, the areas of the first pixel electrodes 311 exposed by the pixel defining layer 330 may be increased in the order of the third color area LA13, the first color area LA11, and the second color area LA12.

The pixel defining layer 330 may include an organic material and/or an inorganic material. In an embodiment, the pixel defining layer 330 may include a material such as photoresist, polyimide resin, acrylic resin, a silicon compound, and/or polyacrylic resin.

An organic light emitting layer 320 may be disposed on each of the first pixel electrodes 311 exposed by the pixel defining layer 330. For example, the organic light emitting layer 320 may have a structure in which a first hole transport layer HTL1, a first light emitting layer EL11, and a first electron transport layer ETL1 are sequentially stacked. In an embodiment, the organic light emitting layers 320 respectively disposed in the color areas LA11 through LA13 may all be blue organic light emitting layers.

A second pixel electrode 312 is disposed on the first electron transport layer ETL1. The second pixel electrode 312 may be a common electrode disposed over the entire first base substrate 101 without distinction between the color areas LA11 through LA13. In addition, the second pixel electrode 312 may be a cathode of each of the organic light emitting diodes 310.

The second pixel electrode 312 may include a material having a low work function. The second pixel electrode 312 may include Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). The second pixel electrode 312 may further include an auxiliary electrode. The auxiliary electrode may include a layer formed by depositing one of the above materials and a transparent metal oxide (such as ITO, IZO, ZnO and/or ITZO) formed on the layer.

When the OLED 1 is of a top emission OLED, a thin conductive layer having a low work function may be formed as the second pixel electrode 312, and a transparent conductive layer such as an ITO layer, an IZO layer, a ZnO layer and/or an $In_2O_3$ layer may be stacked on the thin conductive layer.

In each of the color areas LA11 through LA13, the first pixel electrode 311, the first hole transport layer HTL1, the first light emitting layer EL11, the first electron transport layer ETL1 and the second pixel electrode 312 may constitute (e.g., form) one organic light emitting diode 310.

The types (e.g., kinds) and stacking order of the elements of each organic light emitting diode 310 are not limited to those illustrated in the drawings. Various modified embodiments of the organic light emitting diodes 310 can be applied to the OLED 1, which will be described in more detail later with reference to FIGS. 6 and 7.

A second interlayer insulating layer 350 is disposed on the second pixel electrode 312. The second interlayer insulating layer 350 may be a single layer or a multilayer. The second interlayer insulating layer 350 may include inorganic material (e.g., inorganic matter) when formed as a single layer and may be an organic-inorganic composite material when formed as a multilayer. For example, the second interlayer insulating layer 350 may include metal fluorine, metal oxide, metal nitride, and/or metal oxynitride. The second interlayer insulating layer 350 may be formed by sputtering, atomic layer deposition (ALD), and/or chemical vapor deposition (CVD).

The thickness of the second interlayer insulating layer 350 may be about 1000 Å or less. The second interlayer insulating layer 350 may have a first refractive index. For example, when the second interlayer insulating layer 350 is a single layer, the first refractive index may have a range of about 1.9 to about 2.5 for light (e.g., with a wavelength) of about 560 nm. Throughout this specification, the expression "light of" followed by a number with the unit of nm refers to a light with a wavelength of the specified number. For example, the expression light of about 560 nm refers to light with a wavelength of about 560 nm. When the second interlayer insulating layer 350 is a multilayer, the first refractive index may have a range of about 1.4 to about 2.5 for light of about 560 nm.

The second interlayer insulating layer 350 may improve the light extraction of the organic light emitting diodes 310. In an embodiment, the second interlayer insulating layer 350 may be omitted (e.g., not included). Hereinafter, the term "omitted" refers to that a feature is not included in a structure, or a description of a feature is not repeated.

The encapsulation layer 400 is disposed on the second interlayer insulating layer 350. In an embodiment in which the second interlayer insulating layer 350 is omitted, the encapsulation layer 400 may be disposed directly on the second pixel electrode 312.

The encapsulation layer 400 includes an inorganic layer. The encapsulation layer 400 may include a plurality of stacked layers. In the drawings, the encapsulation layer 400 is illustrated as being a multilayer including a first inorganic layer 410, an organic layer 420, and a second inorganic layer 430 sequentially stacked on the second interlayer insulating layer 350.

The first inorganic layer 410 may be a multilayer. In the current embodiment, the first inorganic layer 410 may have a structure in which a first sub-inorganic layer 411, a second sub-inorganic layer 412 and a third sub-inorganic layer 413 are sequentially stacked. The first sub-inorganic layer 411, the second sub-inorganic layer 412 and the third sub-inorganic layer 413 may have the same refractive index or different refractive indices. In an embodiment, the thickness of the first inorganic layer 410 may be about 2 μm or less. That is, the sum of thicknesses of the first sub-inorganic layer 411, the second sub-inorganic layer 412 and the third sub-inorganic layer 413 may be about 2 μm or less.

The first sub-inorganic layer 411 is disposed on the second interlayer insulating layer 350. The first sub-inorganic layer 411 may include metal oxide, metal nitride, and/or metal oxynitride.

The first sub-inorganic layer 411 may include a material having a second refractive index. For example, the second refractive index may have a range of about 1.4 to about 1.6 for light of about 560 □. The second refractive index may be, but is not limited to, lower than the first refractive index. That is, the first sub-inorganic layer 411 may be a material substantially sparser than the second interlayer insulating layer 350.

In the present specification, a sparse material denotes a material having a relatively lower refractive index and a material through which waves (e.g., light waves) propagate at relatively faster speed. That is, a dense material is a material relatively denser (e.g., denser in optical density) than the sparse material. The dense material and the sparse material are obviously understood as relative concepts between the two materials.

The thickness of the first sub-inorganic layer 411 may be about 3000 Å or less. The first sub-inorganic layer 411 may be, but is not limited to, a single layer. The first sub-inorganic layer 411 may be formed by sputtering, ALD, and/or CVD. In an embodiment, the first sub-inorganic layer 411 may be omitted.

The second sub-inorganic layer 412 is disposed on the first sub-inorganic layer 411. The second sub-inorganic layer 412 may be made of the same material as the first sub-inorganic layer 411 or may include one of the materials exemplified in connection with the first sub-inorganic layer 411.

The second sub-inorganic layer 412 may include a material having a third refractive index. For example, the third refractive index may have a range of about 1.4 to about 1.6 for light of about 560 □. In an embodiment, the third refractive index may be substantially equal to the second refractive index.

The thickness of the second sub-inorganic layer 412 may be about 5000 Å or more. In an embodiment, the second sub-inorganic layer 412 may be a single layer. The second sub-inorganic layer 412 may be formed by the same process (e.g., same kind of process, e.g., the same method) as the first sub-inorganic layer 411 or may be formed by one of the processes exemplified in connection with the first sub-inorganic layer 411.

When the first sub-inorganic layer 411 and the second sub-inorganic layer 412 include the same material and are formed by the same process (e.g., same kind of process), the first sub-inorganic layer 411 may be an element for increasing the thickness of the second sub-inorganic layer 412.

The third sub-inorganic layer 413 is disposed on the second sub-inorganic layer 412. The third sub-inorganic layer 413 may be made of the same material as the first sub-inorganic layer 411 or may include one of the materials exemplified in connection with the first sub-inorganic layer 411.

The third sub-inorganic layer 413 may include a material having a fourth refractive index. For example, the fourth refractive index may have a range of about 1.5 to about 1.57 for light of about 560 □. In an embodiment, the fourth refractive index may be higher than the third refractive index. In this case, the third sub-inorganic layer 413 may be made of a substantially denser material as compared with the second sub-inorganic layer 412. However, the relationship between magnitudes of the third refractive index and the fourth refractive index is not limited to this case.

The thickness of the third sub-inorganic layer 413 may be about 3000 Å or less. In an embodiment, the third sub-inorganic layer 413 may be a single layer. The third sub-inorganic layer 413 may be formed by the same process (e.g., same kind of process) as the first sub-inorganic layer 411 or may be formed by one of the processes exemplified in connection with the first sub-inorganic layer 411.

The organic layer 420 is disposed on the third sub-inorganic layer 413. The organic layer 420 may be made of a polymer such as photocurable acrylic, silicone and/or epoxy. The organic layer 420 may be made of a material having an average transmittance of about 88% or more for light of about 400 □ to about 780 □ and having an average transmittance of less than 10% for light of about 380 □ to about 410 □.

The organic layer 420 may have a fifth refractive index. The fifth refractive index may have a range of about 1.5 to about 1.6 for light of about 560 □. In an embodiment, the fifth refractive index may be lower than the fourth refractive index. In this case, the organic layer 420 may be made of a substantially sparser material as compared with the third sub-inorganic layer 413.

The thickness of the organic layer 420 may be about 2 □ to about 10 □. In an embodiment, the organic layer 420 may be a single layer or a multilayer. The organic layer 420 may be formed by inkjet printing, slit coating, screen printing, and/or one-drop filling (ODF).

The second inorganic layer 430 is disposed on the organic layer 420. The second inorganic layer 430 may be a multilayer. In the current embodiment, the second inorganic layer 430 has a structure in which a fourth sub-inorganic layer 431, a fifth sub-inorganic layer 432, and a sixth sub-inorganic layer 433 are sequentially stacked. The fourth sub-inorganic layer 431, the fifth sub-inorganic layer 432 and the sixth sub-inorganic layer 433 may have the same refractive index or different refractive indices. In an embodiment, the thickness of the second inorganic layer 430 may be about 2.6 □ or less. For example, the sum of thicknesses of the fourth sub-inorganic layer 431, the fifth sub-inorganic layer 432, and the sixth sub-inorganic layer 433 may be about 2 □ or less.

The fourth sub-inorganic layer 431 is disposed on the organic layer 420. The fourth sub-inorganic layer 431 may be made of the same material as the first sub-inorganic layer 411 or may include one of the materials exemplified in connection with the first sub-inorganic layer 411.

The fourth sub-inorganic layer 431 may include a material having a seventh refractive index. For example, the seventh refractive index may have a range of about 1.5 to about 1.57 for light of about 560 □.

The thickness of the fourth sub-inorganic layer 431 may be about 3000 Å or less. In an embodiment, the fourth sub-inorganic layer 431 may be a single layer. The fourth sub-inorganic layer 431 may be formed by the same process (e.g., same kind of process) as the first sub-inorganic layer 411 or may be formed by one of the processes exemplified in connection with the first sub-inorganic layer 411. In an embodiment, the fourth sub-inorganic layer 431 may be omitted.

The fifth sub-inorganic layer 432 is disposed on the fourth sub-inorganic layer 431. The fifth sub-inorganic layer 432 may be made of the same material as the first sub-inorganic layer 411 or may include one of the materials exemplified in connection with the first sub-inorganic layer 411.

The fifth sub-inorganic layer 432 may include a material having an eighth refractive index. For example, the eighth refractive index may have a range of about 1.6 to about 1.9 for light of about 560 □. In an embodiment, the eighth refractive index may be equal to or higher than the seventh refractive index. In this case, the fifth sub-inorganic layer 432 may be made of the same material as the fourth sub-inorganic layer 431 or may be made of a substantially denser material as compared with the fourth sub-inorganic layer 431.

The thickness of the fifth sub-inorganic layer 432 may be about 2 □ to about 10 □. In an embodiment, the fifth sub-inorganic layer 432 may be a single layer. The fifth sub-inorganic layer 432 may be formed by the same process (e.g., same kind of process) as the first sub-inorganic layer 411 or may be formed by one of the processes exemplified in connection with the first sub-inorganic layer 411.

When the fourth sub-inorganic layer 431 and the fifth sub-inorganic layer 432 include the same material and are formed by the same process (e.g., same kind of process), the fourth sub-inorganic layer 431 may be an element for increasing the thickness of the fifth sub-inorganic layer 432.

The sixth sub-inorganic layer 433 is disposed on the fifth sub-inorganic layer 432. The sixth sub-inorganic layer 433 may be made of the same material as the first sub-inorganic layer 411 or may include one of the materials exemplified in connection with the first sub-inorganic layer 411.

The sixth sub-inorganic layer 433 may include a material having a ninth refractive index. For example, the ninth refractive index may have a range of about 1.55 to about 1.65 for light of about 560 □. In an embodiment, the ninth refractive index may be higher than the eighth refractive index. In this case, the sixth sub-inorganic layer 433 may be made of a substantially denser material as compared with the fifth sub-inorganic layer 432.

The thickness of the sixth sub-inorganic layer 433 may be about 3000 Å or less. In an embodiment, the sixth sub-inorganic layer 433 may be a single layer. The sixth sub-inorganic layer 433 may be formed by the same process (e.g., same kind of process) as the first sub-inorganic layer 411 or may be formed by one of the processes exemplified in connection with the first sub-inorganic layer 411.

The path of light emitted from each organic light emitting diode 310 can be adjusted by adjusting the refractive index of each layer in the encapsulation layer 400. This will be described in more detail later with reference to FIG. 8.

The second substrate 30 will now be described in more detail. In the drawings, the OLED 1 includes a third capping layer 513, a second capping layer 512, second color conversion filters, a first capping layer 511, and first color conversion filters sequentially disposed on the first substrate 10 and the filling layer 70 in the third direction dr3. Because the second substrate 30 faces the first substrate 10, the direction of the stacking order of the second substrate 30 may be opposite to that of the stacking order of the first substrate 10. That is, the direction of the stacking order of the first substrate 10 may be the third direction dr3, and the direction of the stacking order of the second substrate 30 may be a direction opposite to the third direction dr3. Therefore, for ease of description, only in the description of the second substrate 30, when a first element included in the second substrate 30 is expressed as being disposed on a second element, it refers to that the first element is disposed in the direction opposite to the third direction dr3 from the second element.

The second substrate 30 includes a second base substrate 601, a first black matrix 521, the first color conversion filters, the first capping layer 511, the second color conversion filters, the second capping layer 512, a second black matrix 522, and the third capping layer 513 that are sequentially stacked. In addition, the second substrate 30 may further include a light transmission pattern 533 formed on the same layer as the second color conversion filters.

The light emitting area including the color areas LA11 through LA13 and the non-light emitting area NLA may be defined in the second substrate 30.

The second base substrate 601 may be made of a light transmitting material. The second base substrate 601 may be a glass substrate and/or a plastic substrate. In an embodiment, the second base substrate 601 may be a window member. The window member may protect the first substrate 10 and the second substrate 30 from external scratches, etc.

The first black matrix 521 is disposed on the second base substrate 601. The first black matrix 521 may be disposed along the boundaries of each of the color areas LA11 through LA13 and may block transmission of light. The first black matrix 521 may overlap the pixel defining layer 330. Throughout this disclosure, when two elements are described as "overlap" each other, it refers to that the two elements overlap each other in the thickness direction (i.e., the third direction dr3) of the OLED 1, unless otherwise defined. The first black matrix 521 may include openings that define the color areas LA11 through LA13, respectively.

The first black matrix 521 may be made of any suitable material that can block light. In an embodiment, the first black matrix 521 may be made of a photosensitive composition, organic material (e.g., organic matter), and/or a metallic material. The photosensitive composition may include, in an embodiment, a binder resin, a polymerizable monomer, a polymerizable oligomer, a pigment, a dispersant, etc. The metallic material may include chromium, etc.

The first color conversion filters are disposed on the second base substrate 601 and the first black matrix 521. The first color conversion filters may overlap the openings of the first black matrix 521.

In an embodiment, the first color conversion filters may be color filters 540. Each of the color filters 540 may only transmit light of a specific color and block transmission of light of other colors by absorbing the light. Light that passes through each of the color filters 540 may display one of the primary colors, for example, the three primary colors such as red, green and blue. However, the display color of light that passes through each of the color filters 540 is not limited to a primary color and may also be any one of cyan, magenta, yellow, and white colors.

In the current embodiment, the first color conversion filters may be a first color filter (e.g., a red first color filter) 541, a second color filter (e.g., a green second color filter) 542, and a third color filter (e.g., a blue third color filter) 543.

The first color filter 541 may be disposed in the first color area LA11. The first color filter 541 may transmit light of a first color but block light of a second color and light of a third color by absorbing the light of the second color and the light of the third color. Here, the first color may be red, the second color may be green, and the third color may be blue. For example, the first color filter 541 may be a red color filter and may include a red colorant. The red color filter may transmit red light but block green light and blue light by absorbing the green light and the blue light.

The second color filter 542 may be disposed in the second color area LA12. The second color filter 542 may transmit light of the second color but block light of the first color and light of the third color by absorbing the light of the first color and the light of the third color. For example, the second color filter 542 may be a green color filter and may include a green colorant. The green color filter may transmit green light but block red light and blue light by absorbing the red light and the blue light.

The third color filter 543 may be disposed in the third color area LA13. The third color filter 543 may transmit light of the third color but block light of the first color and light of the second color by absorbing the light of the first color and the light of the second color. For example, the third color filter 543 may be a blue color filter and may include a blue colorant. The blue color filter may transmit blue light but block red light and green light by absorbing the red light and the green light.

Because the color filters 540 absorb a considerable amount of external light, reflection of external light can be reduced even without addition of a polarizer and/or the like.

In an embodiment, boundary portions between the color filters 540 may be located in the non-light emitting area NLA. That is, the boundary portions between the color filters 540 may overlap the first black matrix 521.

The first capping layer 511 is disposed on the first color conversion filters. The first capping layer 511 may prevent or substantially prevent impurities (such as moisture and/or air) from being introduced from the outside and damaging and/or contaminating color filters and/or the like. In addition, the first capping layer 511 may prevent or substantially prevent a colorant contained in each color filter from diffusing to other elements.

In some embodiments, the first capping layer 511 may be made of an inorganic material. For example, the first capping layer 511 may include silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

The first capping layer 511 may be formed by sputtering, ALD, and/or CVD.

The second color conversion filters and the light transmission pattern 533 are disposed on the first capping layer 511. The second color conversion filters may be wavelength conversion patterns 530. Each of the wavelength conversion patterns 530 may convert a peak wavelength of incident light into another (e.g., specific) peak wavelength and output light having the other (e.g., specific) peak wavelength. Light that passes through each of the wavelength conversion patterns 530 may display one of the primary colors, for example, the three primary colors such as red, green and blue. However, the display color of light that passes through each of the wavelength conversion patterns 530 is not limited to a primary color and may also be any one of cyan, magenta, yellow, and white colors.

In the current embodiment, the wavelength conversion patterns 530 include a first wavelength conversion pattern 531 and a second wavelength conversion pattern 532 that are different from each other.

The first wavelength conversion pattern 531 may be disposed in the first color area LA11. In an exemplary embodiment, the first wavelength conversion pattern 531 may convert blue light into red light in the range of about 610 □ to about 650 □ and output the red light. The first wavelength conversion pattern 531 may not be disposed in the second color area LA12 and the third color area LA13.

The first wavelength conversion pattern 531 may include a first base resin 5311 and a first wavelength conversion material 5313 dispersed in the first base resin 5311, and may further include a first scatterer 5315 dispersed in the first base resin 5311.

The first base resin 5311 may be any suitable material having high light transmittance and suitable (e.g., superior) dispersion characteristics for the first wavelength conversion material 5313 and the first scatterer 5315. For example, the first base resin 5311 may include an organic material such as epoxy resin, acrylic resin, cardo resin, and/or imide resin.

The first wavelength conversion material 5313 may convert a peak wavelength of incident light to another (e.g., specific) peak wavelength. Examples of the first wavelength conversion material 5313 may include quantum dots, quantum rods, and phosphors. For example, a quantum dot may be a particulate material that emits light of a specific color when an electron transits (e.g., moves) from a conduction band to a valence band.

The quantum dot may be a semiconductor nanocrystalline material. The quantum dot may have a specific band gap according to its composition and size. Thus, the quantum dot may absorb light and then emit light having a unique wavelength. Examples of a semiconductor nanocrystal of the quantum dot include a Group IV nanocrystal, a Group II-VI compound nanocrystal, a Group III-V compound nanocrystal, a Group IV-VI nanocrystal, and combinations thereof.

The Group IV nanocrystal may be, but is not limited to, silicon (Si), germanium (Ge), and/or a binary compound such as silicon carbide (SiC) and/or silicon germanium (SiGe).

In addition, the Group II-VI compound nanocrystal may be, but is not limited to, a binary compound (such as CdSe, CdTe, ZnS, ZnSe, ZnTe, ZnO, HgS, HgSe, HgTe, MgSe, MgS or a combination thereof), a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS or a combination thereof), and/or a quaternary compound (such as HgZnTeS, CdZnSeS, CdZnSeTe, CdZnSTe, CdHgSeS, CdHgSeTe, CdHgSTe, HgZnSeS, HgZnSeTe, HgZnSTe or a combination thereof).

In addition, the Group III-V compound nanocrystal may be, but is not limited to, a binary compound (such as GaN, GaP, GaAs, GaSb, AlN, AlP, AlAs, AlSb, InN, InP, InAs, InSb or a combination thereof), a ternary compound (such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP or a combination thereof), and/or a quaternary compound (such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb or a combination thereof).

The Group IV-VI nanocrystal may be, but is not limited to, a binary compound (such as SnS, SnSe, SnTe, PbS, PbSe, PbTe or a combination thereof), a ternary compound (such as SnSeS, SnSeTe, SnSTe, PbSeS, PbSeTe, PbSTe, SnPbS, SnPbSe, SnPbTe or a combination thereof), and/or a quaternary compound (such as SnPbSSe, SnPbSeTe, SnPbSTe or a combination thereof).

The quantum dot may have a core-shell structure including a core containing the above-described nanocrystal and a shell surrounding the core. The shell of the quantum dot may serve as a protective layer for maintaining semiconductor characteristics by preventing or reducing chemical denaturation of the core, and/or as a charging layer for giving electrophoretic characteristics to the quantum dot. The shell may be a single layer or a multilayer. Examples of the shell of the quantum dot include a metal or non-metal oxide, a semiconductor compound, and a combination thereof.

For example, the metal or non-metal oxide may be, but is not limited to, a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO), and/or a ternary compound (such as $MgAl_2O_4$, $CoFe_2O_4$, $NiFe_2O_4$ and/or $CoMn_2O_4$).

In addition, the semiconductor compound may be, but is not limited to, CdS, CdSe, CdTe, ZnS, ZnSe, ZnTe, GaAs, GaP, GaSb, HgS, HgSe, HgTe, InAs, InP, InSb, AlAs, AlP, and/or AlSb.

Light emitted from the first wavelength conversion material 5313 may have a full width at half maximum (FWHM) of about 45 nm or less, about 40 nm or less, or about 30 nm or less. Therefore, the color purity and color reproducibility of the display device can be improved. In addition, the light emitted from the first wavelength conversion material 5313 may be radiated in various directions regardless of the incident direction of incident light. Therefore, the lateral visibility of the display device can be improved.

A portion of light L emitted from an organic light emitting diode 310 may be transmitted through the first wavelength conversion pattern 531 without being converted into red light by the first wavelength conversion material 5313. A component (e.g., that portion of light L) incident on the first color filter 541 without being converted by the first wavelength conversion pattern 531 may be blocked by the first color filter 541. On the other hand, red light output from the first wavelength conversion pattern 531 may be transmitted to the outside through the first color filter 541. Accordingly, first light L1 output from the first color area LA11 may be red light.

The first scatterer 5315 may have a refractive index different from that of the first base resin 5311 and may form an optical interface with the first base resin 5311. For example, the first scatterer 5315 may be light scattering particles. The first scatterer 5315 may be any suitable material that can scatter at least a portion of transmitted light. For example, the first scatterer 5315 may be metal oxide particles and/or organic particles. Examples of the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). Examples of the organic particle material include acrylic resin and urethane resin. The first scatterer 5315 may scatter incident light in random directions regardless of the incident direction of the light without substantially changing the wavelength of the light transmitted through the first wavelength conversion pattern 531. Accordingly, the first scatterers 5315 can increase the length of the path of the light transmitted through the first wavelength conversion pattern 531 and increase the color conversion efficiency of the first wavelength conversion material 5313.

In some embodiments, the thickness of the first wavelength conversion pattern 531 may be 3 □ to 15 □. The content (e.g., weight percentage) of the first wavelength conversion material 5313 in the first wavelength conversion pattern 531 may be 10% to 60%. In addition, the content (e.g., weight percentage) of the first scatterer 5315 in the first wavelength conversion pattern 531 may be 2% to 15%.

The second wavelength conversion pattern 532 may be disposed in the second color area LA12. In an exemplary embodiment, the second wavelength conversion pattern 532 may convert blue light into green light in the range of about 510 □ to about 550 □ and output the green light. The second wavelength conversion pattern 532 may not be disposed in the first color area LA11 and the third color area LA13.

The second wavelength conversion pattern 532 may include a second base resin 5321 and a second wavelength conversion material 5323 dispersed in the second base resin 5321, and may further include a second scatterer 5325 dispersed in the second base resin 5321.

The second base resin 5321 may be any suitable material having high light transmittance and suitable (e.g., superior) dispersion characteristics for the second wavelength conversion material 5323 and the second scatterer 5325. For example, the second base resin 5321 may include an organic material such as epoxy resin, acrylic resin, cardo resin, and/or imide resin.

Examples of the second wavelength conversion material 5323 may include quantum dots, quantum rods, and phosphors. Other details of the second wavelength conversion material 5323 are substantially the same or similar to those of the first wavelength conversion material 5313 described above, and thus a detailed description thereof is omitted.

The first wavelength conversion material 5313 and the second wavelength conversion material 5323 may both be composed of quantum dots. In this case, the diameter of quantum dots constituting the first wavelength conversion material 5313 may be greater than that of quantum dots constituting the second wavelength conversion material 5323. For example, the quantum dot size of the first wavelength conversion material 5313 may be about 55 Å to about 65 Å. In addition, the quantum dot size of the second wavelength conversion material 5323 may be about 40 Å to about 50 Å.

Light that passed through the first wavelength conversion pattern 531 and the second wavelength conversion pattern 532 may be in an unpolarized state through depolarization. As used herein, the term "unpolarized light" refers to light that is not composed of only polarization components in a specific direction, that is, light that is not polarized only in a specific direction. In other words, the term "unpolarized light" refers to light that is composed of random polarization components. An example of the unpolarized light is natural light.

The second scatterer 5325 may have a refractive index different from that of the second base resin 5321 and may form an optical interface with the second base resin 5321. For example, the second scatterer 5325 may be light scattering particles. Other details of the second scatterer 5325 are substantially the same or similar to those of the first scatterer 5315 described above, and thus a detailed description thereof is omitted.

In some embodiments, the thickness of the second wavelength conversion pattern 532 may be 3 □ to 15 □. The content (e.g., weight percentage) of the second wavelength conversion material 5323 in the second wavelength conversion pattern 532 may be 10% to 60%. In addition, the content (e.g., weight percentage) of the second scatterer 5325 in the second wavelength conversion pattern 532 may be 2% to 15%.

Light L emitted from an organic light emitting diode 310 may be provided to the second wavelength conversion pattern 532, and the second wavelength conversion material 5323 may convert the light L emitted from the organic light emitting diode 310 into green light and output the green light.

A portion of the light L emitted from the organic light emitting diode 310 may be transmitted through the second wavelength conversion pattern 532 without being converted into green light by the second wavelength conversion material 5323 and may be blocked by the second color filter 542. On the other hand, of the emitted light L, green light output from the second wavelength conversion pattern 532 may be transmitted to the outside through the second color filter 542. Accordingly, second light L2 output from the second color area LA12 may be green light.

The light transmission pattern 533 may be located in the third color area LA13 and may not be located in the first color area LA11 and the second color area LA12. The light transmission pattern 533 may transmit incident light substantially as it is.

The light transmission pattern 533 may include a third base resin 5331 and a third scatterer 5335 dispersed in the third base resin 5331.

The third base resin 5331 may be made of an organic material having high light transmittance. The third base resin 5331 may be made of the same material as the first base resin 5311 or may include at least one of the materials mentioned as examples of the material of the first base resin 5311.

The third scatterer 5335 may have a refractive index different from that of the third base resin 5331 and may form an optical interface with the third base resin 5331. For example, the third scatterer 5335 may be light scattering particles. The third scatterer 5335 may be any suitable material that can scatter at least a portion of transmitted light. For example, the third scatterer 5335 may be metal oxide particles and/or organic particles. Examples of the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). Examples of the organic particle material include acrylic resin and urethane resin. The third scatterer 5335 may scatter incident light in random directions regardless of the incident direction of the light without substantially changing the wavelength of the light transmitted through the light transmission pattern 533. Accordingly, the third scatterer 5335 can improve the lateral visibility of the light transmitted through the light transmission pattern 533.

Light L emitted from an organic light emitting diode 310 is transmitted to the outside through the light transmission pattern 533 and the third color filter 543. That is, third light L3 output from the third color area LA13 may have the same wavelength as the light L, e.g., blue light emitted from the organic light emitting diode 310.

The first wavelength conversion pattern 531, the second wavelength conversion pattern 532 and the light transmission pattern 533 may be spaced apart from each other in a plan view. Therefore, the respective materials of the first wavelength conversion pattern 531, the second wavelength conversion pattern 532 and the light transmission pattern 533 may not be mixed with each other. Spaces may be formed between the first wavelength conversion pattern 531, the second wavelength conversion pattern 532 and the light transmission pattern 533 that are spaced apart from each other.

The second capping layer 512 may be disposed on the first wavelength conversion pattern 531, the second wavelength conversion pattern 532 and the light transmission pattern 533. The second capping layer 512 may cover the first wavelength conversion pattern 531, the second wavelength conversion pattern 532, and the light transmission pattern 533. The second capping layer 512 may include (e.g., cover) the spaces between the first wavelength conversion pattern 531, the second wavelength conversion pattern 532 and the light transmission pattern 533. In these spaces, the second capping layer 512 may directly contact the first capping layer 511.

The second capping layer 512, together with the first capping layer 511, may seal the first wavelength conversion pattern 531, the second wavelength conversion pattern 532 and the light transmission pattern 533, thereby preventing or substantially preventing impurities (such as moisture and/or air) from being introduced from the outside and damaging and/or contaminating the first wavelength conversion pattern 531, the second wavelength conversion pattern 532 and the light transmission pattern 533.

The second capping layer 512 may be made of inorganic material (e.g., inorganic matter). The second capping layer 512 may be made of the same material as the first capping layer 511 or may include at least one of the materials mentioned in the description of the first capping layer 511.

The thickness of the second capping layer 512 may be about 5000 Å or less. The second capping layer 512 may be, but is not limited to, a single layer. The second capping layer 512 may be formed by the same method as the first capping layer 511 or may be formed by one of the methods exemplified in connection with the first capping layer 511.

The second capping layer 512 may include a material having a tenth refractive index. For example, the tenth refractive index may have a range of about 1.4 to about 2.0 for light of about 560 □.

The second black matrix 522 is disposed on the second capping layer 512. The second black matrix 522 may be disposed along the boundaries of each of the color areas LA11 through LA13 and may block transmission of light. The second black matrix 522 may overlap the pixel defining layer 330. The second black matrix 522 may overlap the spaces between the first wavelength conversion pattern 531, the second wavelength conversion pattern 532 and the light transmission pattern 533.

The second black matrix 522 may be made of any suitable material that can block light. The second black matrix 522 may be made of the same material as the first black matrix 521 or may include at least one of the materials mentioned in the description of the first black matrix 521.

The third capping layer 513 is disposed on the second capping layer 512 and the second black matrix 522. The third capping layer 513 may overlap the second capping layer 512 in the light emitting area and may overlap the second black matrix 522 in the non-light emitting area NLA.

The third capping layer 513 may be made of inorganic material (e.g., inorganic matter). The third capping layer 513 may be made of the same material as the first capping layer 511 or may include at least one of the materials mentioned in the description of the first capping layer 511.

The thickness of the third capping layer 513 may be about 5000 Å or less. The third capping layer 513 may be, but is not limited to, a single layer. The third capping layer 513 may be formed by the same method as the first capping layer 511 or may be formed by one of the methods exemplified in connection with the first capping layer 511.

The third capping layer 513 may include a material having an eleventh refractive index. For example, the eleventh refractive index may have a range of about 1.55 to about 1.65 for light of about 560 □. In an embodiment, the third capping layer 513 may be omitted.

The filling layer 70 is located between the third capping layer 513 and the sixth sub-inorganic layer 433. The filling layer 70 may include a material having a twelfth refractive index. The twelfth refractive index may have a range of about 1.4 to about 1.6 for light of about 560 □. In an embodiment, the twelfth refractive index may be lower than the eleventh refractive index and the ninth refractive index. In this case, the filling layer 70 may be made of a substantially sparser material as compared with the third capping layer 513 and the sixth sub-inorganic layer 433.

Figure 5:
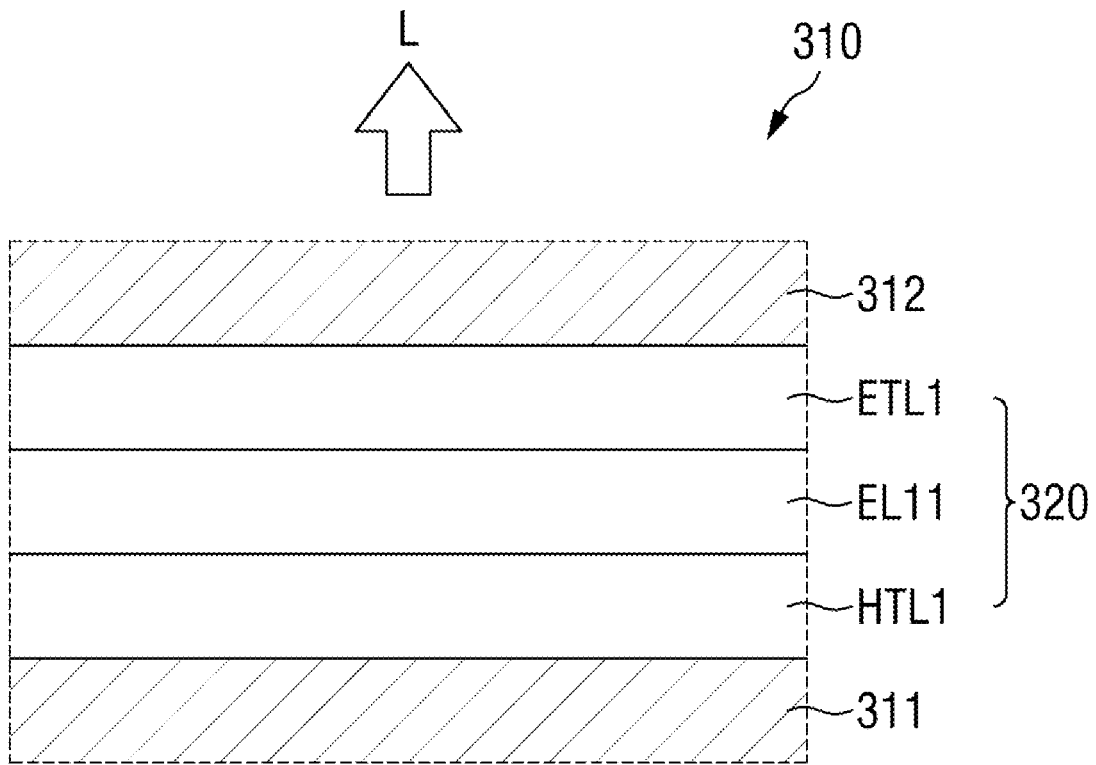
FIG. 5 is an enlarged cross-sectional view of an organic light emitting diode illustrated in FIG. 4.
Figure 6:
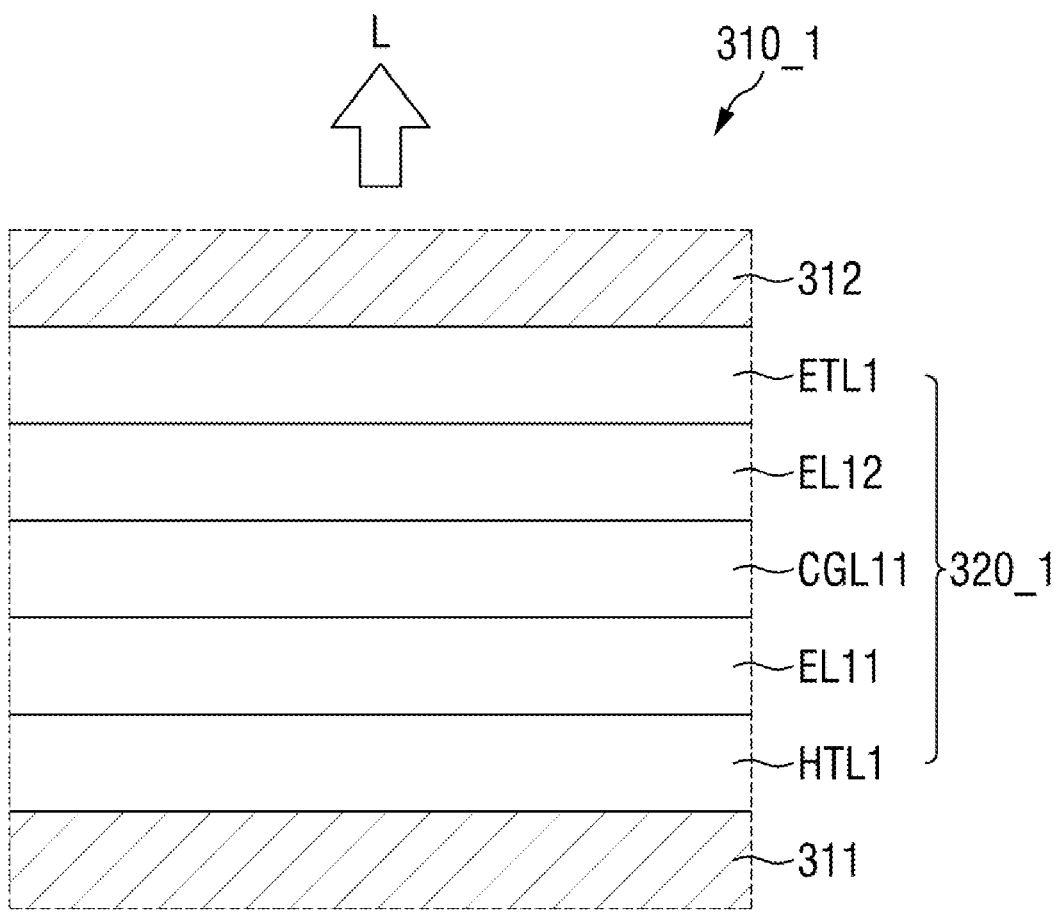
FIG. 6 is a cross-sectional view of a modified example of the organic light emitting diode illustrated in FIG. 5.
Figure 7:
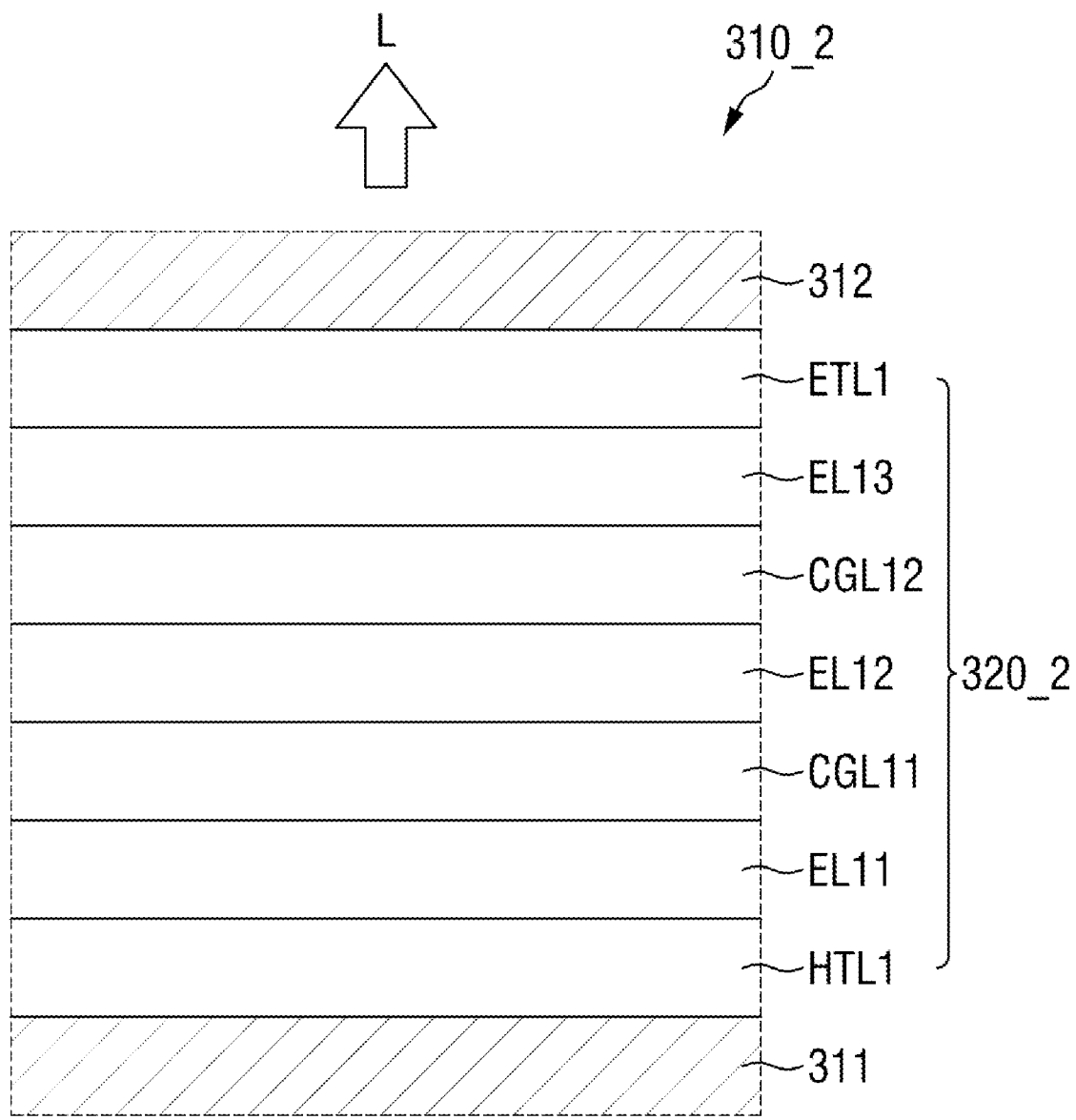
FIG. 7 is a cross-sectional view of a modified example of the organic light emitting diode illustrated in FIG. 5.

FIG. 6 is a cross-sectional view of a modified example of the organic light emitting diode 310 illustrated in FIG. 5. FIG. 7 is a cross-sectional view of a modified example of the organic light emitting diode 310 illustrated in FIG. 5.

Referring to FIG. 6, an organic light emitting layer 320_1 may further include a first charge generation layer CGL11 located on a first light emitting layer EL11 and a second light emitting layer EL12 located on the first charge generation layer CGL11, and a first charge transport layer ETL1 may be located on the second light emitting layer EL12.

The first charge generation layer CGL11 may inject electric charges into each adjacent light emitting layer. The first charge generation layer CGL11 may adjust the charge balance between the first light emitting layer EL11 and the second light emitting layer EL12. In some embodiments, the first charge generation layer CGL11 may include an n-type charge generation layer and a p-type charge generation layer. The p-type charge generation layer may be disposed on the n-type charge generation layer.

The second light emitting layer EL12 may, but not necessarily, emit blue light, similar to the first light emitting layer EL11. The second light emitting layer EL12 may emit blue light having the same or different peak wavelength as blue light emitted from the first light emitting layer EL11. In an embodiment, the first light emitting layer EL11 and the second light emitting layer EL12 may emit light of different colors. That is, while the first light emitting layer EL11 emits blue light, the second light emitting layer EL12 may emit green light.

Because the organic light emitting layer 320_1 structured as described above includes two light emitting layers, it may have better luminous efficiency and a longer life (e.g., lifespan) than the structure of FIG. 5.

FIG. 7 shows that an organic light emitting layer 320_2 can include three light emitting layers EL11 through EL13 and two charge generation layers CGL11 and CGL12 interposed between the three light emitting layers EL11 through EL13. Referring to FIG. 7, the organic light emitting layer 320_2 may further include a first charge generation layer CGL11 located on a first light emitting layer EL11, a second light emitting layer EL12 located on the first charge generation layer CGL11, a second charge generation layer CGL12 located on the second light emitting layer EL12, and a third light emitting layer EL13 located on the second charge generation layer CGL12. A first charge transport layer ETL1 may be located on the third light emitting layer EL13.

The third light emitting layer EL13 may emit blue light, similar to the first light emitting layer EL11 and the second light emitting layer EL12. In an embodiment, each of the first light emitting layer EL11, the second light emitting layer EL12, and the third light emitting layer EL13 may emit blue light. Here, peak wavelengths of the blue light emitted from the first through third light emitting layers EL11 through EL13 may all be the same, or some of the peak wavelengths may be different. In an embodiment, the first light emitting layer EL11, the second light emitting layer EL12, and the third light emitting layer EL13 may emit light of different colors. For example, each light emitting layer may emit blue light or green light. Alternatively, the light emitting layers may respectively emit red light, green light and blue light, thereby providing white light as a whole.

The path of light emitted from an organic light emitting diode 310 will now be described in more detail with reference to FIGS. 8 and 9.

Figure 8:
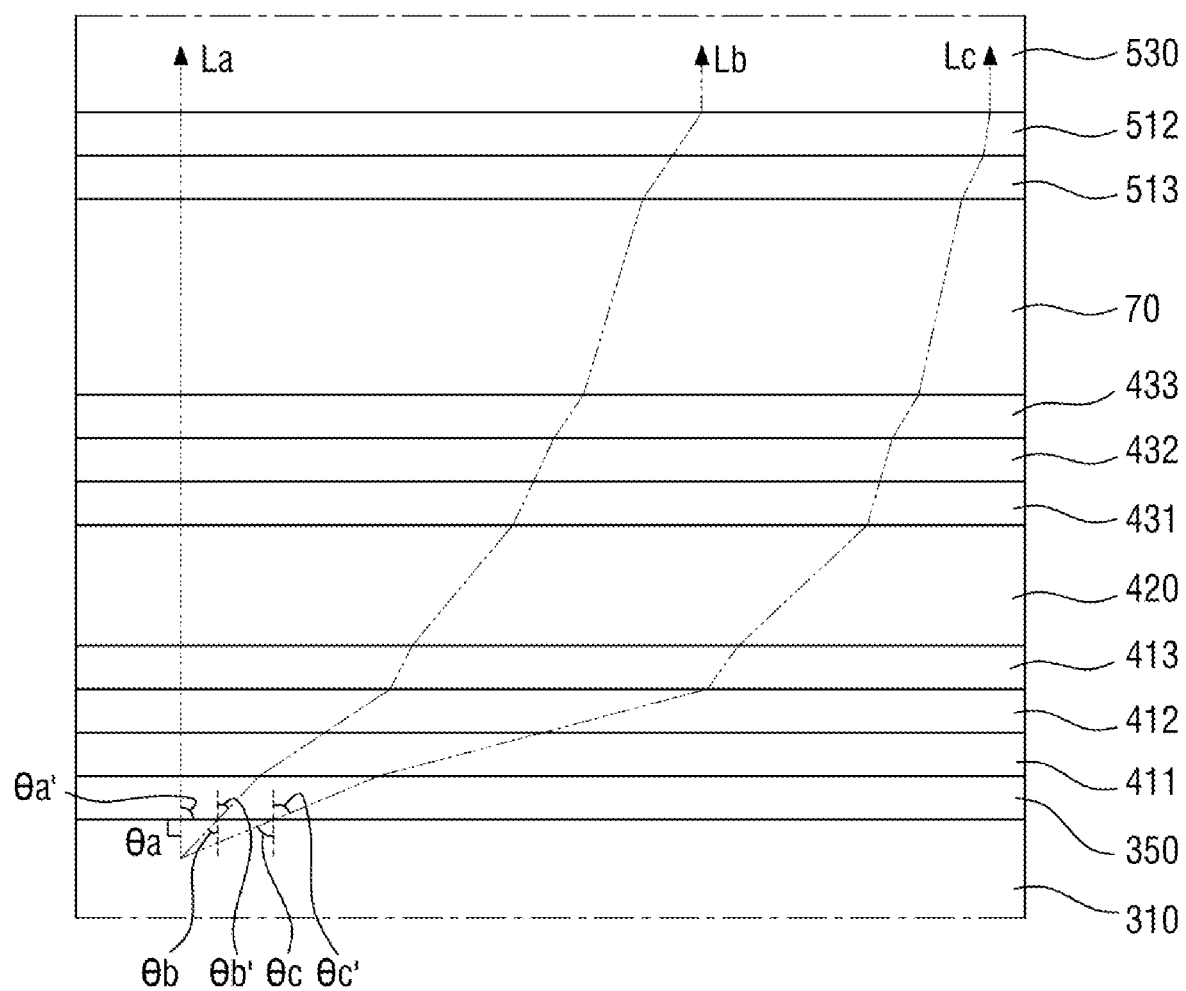
FIG. 8 is a schematic cross-sectional view illustrating a light path between a second interlayer insulating layer and a second capping layer in the embodiment of FIG. 4.

FIG. 8 is a schematic cross-sectional view illustrating a light path between the second interlayer insulating layer 350 and the second capping layer 512 in the embodiment of FIG. 4. FIG. 9 is a schematic cross-sectional view illustrating a light path in another OLED as a comparative example of FIG. 8. FIGS. 8 and 9 illustrate cross-sections of any one color area (e.g., any one of the color areas). In FIGS. 8 and 9, the thickness of each element is exaggerated for ease of description.

Figure 9:
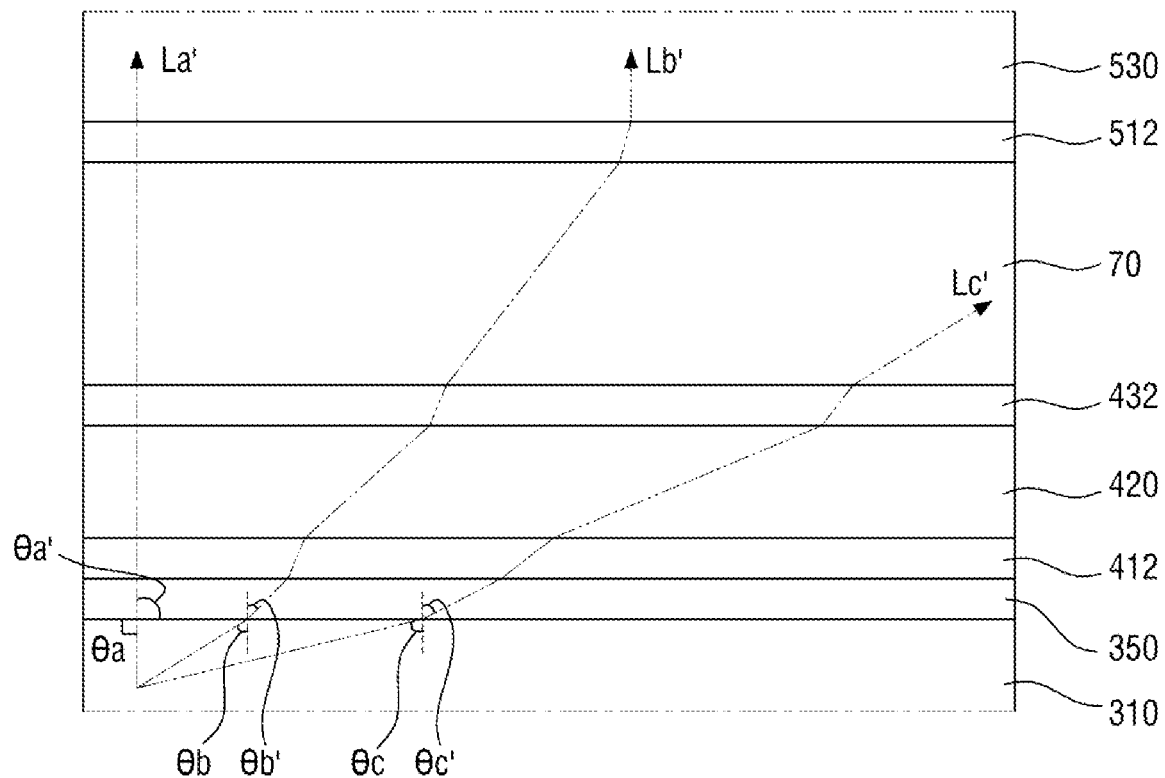
FIG. 9 is a schematic cross-sectional view illustrating a light path in another OLED as a comparative example of FIG. 8.

The OLED of FIG. 9 does not include a first sub-inorganic layer 411, a third sub-inorganic layer 413, a fourth sub-inorganic layer 431, a sixth sub-inorganic layer 433 and a third capping layer 513, unlike the embodiment of FIG. 8.

As described above, light emitted from an organic light emitting diode 310 of the first substrate 10 may travel toward the second substrate 30. In FIGS. 8 and 9, emitted light L includes, between the organic light emitting diode 310 and the second interlayer insulating layer 350, first emitted light La having an incident angle of 0 degrees (θa) and a refraction angle of 0 degrees (θa'), second emitted light Lb having an incident angle of a first angle θb and a refraction angle of a second angle θb', and third emitted light Lc having an incident angle of a third angle θc and a refraction angle of a fourth angle θc'. Here, the first through fourth angles θb, θb', θc and θc' are acute angles. The third angle θc is greater than the first angle θb.

Referring to FIG. 8, light La through Lc emitted from an organic light emitting diode 310 of the OLED 1 according to the current embodiment may sequentially pass through the second interlayer insulating layer 350, the first sub-inorganic layer 411, the second sub-inorganic layer 412, the third sub-inorganic layer 413, the organic layer 420, the fourth sub-inorganic layer 431, the fifth sub-inorganic layer 432, the sixth sub-inorganic layer 433, the filling layer 70, the third capping layer 513 and the second capping layer 512 to reach a second color conversion filter or the light transmission pattern 533.

Referring to FIG. 9, light La' through Lc' emitted from an organic light emitting diode 310 of the OLED according to the comparative embodiment may sequentially pass through a second interlayer insulating layer 350, a second sub-inorganic layer 412, an organic layer 420, a fifth sub-inorganic layer 432, a filling layer 70 and a second capping layer 512 to reach a second color conversion filter or a light transmission pattern 533.

First, the emitted light La through Lc of FIG. 8 will be described in more detail.

The first light La may sequentially pass through a plurality of layers from the second interlayer insulating layer 350 to the second capping layer 512 without being refracted and then reach a wavelength conversion pattern 530 or the light transmission pattern 533.

A refraction angle of each of the second emitted light Lb and the third emitted light Lc may become greater than an incident angle at a boundary surface between the second interlayer insulating layer 350 and the first sub-inorganic layer 411 and the second sub-inorganic layer 412, which are materials sparser than the second interlayer insulating layer 350. The refraction angle of each of the second emitted light Lb and the third emitted light Lc may become smaller than the incident angle at a boundary surface between the first and second sub-inorganic layers 411 and 412 and the third sub-inorganic layer 413, which is a material denser than the first sub-inorganic layer 411 and the second sub-inorganic layer 412. The refraction angle of each of the second emitted light Lb and the third emitted light Lc may become greater than the incident angle at a boundary surface between the third sub-inorganic layer 413 and the organic layer 420, which is a material sparser than the third sub-inorganic layer 413. The refraction angle of each of the second emitted light Lb and the third emitted light Lc may become smaller than the incident angle at a boundary surface between the organic layer 420 and the fourth and fifth sub-inorganic layers 431 and 432, which are materials denser than the organic layer 420. The refraction angle of each of the second emitted light Lb and the third emitted light Lc may become smaller than the incident angle at a boundary surface between the fourth and fifth sub-inorganic layers 431 and 432 and the sixth sub-inorganic layer 433, which is a material denser than the fourth and fifth sub-inorganic layers 431 and 432. The refraction angle of each of the second emitted light Lb and the third emitted light Lc may become greater than the incident angle at a boundary surface between the sixth sub-inorganic layer 433 and the filling layer 70, which is a material sparser than the sixth sub-inorganic layer 433. The refraction angle of each of the second emitted light Lb and the third emitted light Lc may become smaller than the incident angle at a boundary surface between the filling layer 70 and the third and second capping layers 513 and 512, which are materials denser than the filling layer 70. In this manner, the second emitted light Lb and the third emitted light Lc may all reach the wavelength conversion pattern 530 or the light transmission pattern 533.

Next, the emitted light La' through Lc' of FIG. 9 will be described.

As in the OLED 1 of FIG. 8, the second emitted light Lb' from the organic light emitting diode 310 of FIG. 9 may reach a wavelength conversion pattern 530 or the light transmission pattern 533.

On the other hand, the third emitted light Lc' may not reach the wavelength conversion pattern 530 or the light transmission pattern 533. Because the third sub-inorganic layer 413 and the sixth sub-inorganic layer 433, which are materials relatively denser than elements disposed under the third sub-inorganic layer 413 and the sixth sub-inorganic layer 433 are omitted from the OLED of FIG. 9, a section in which the refraction angle becomes smaller than the incident angle may be reduced as compared with the OLED 1 of FIG. 8. Therefore, of the emitted light, more (e.g., a greater portion of) light L may not reach the wavelength conversion pattern 530 or the light transmission pattern 533 in the OLED of FIG. 9 than in the OLED 1 of FIG. 8.

The OLED 1 can reduce light loss by placing relatively denser materials in a direction in which emitted light L travels.

The relationship between the difference in interfacial refractive index (e.g., the difference in refractive index between the layers forming the interface) and the light loss will now be described in more detail utilizing experimental examples of FIGS. 10 through 15, according to embodiments of the present disclosure.

Figure 10:
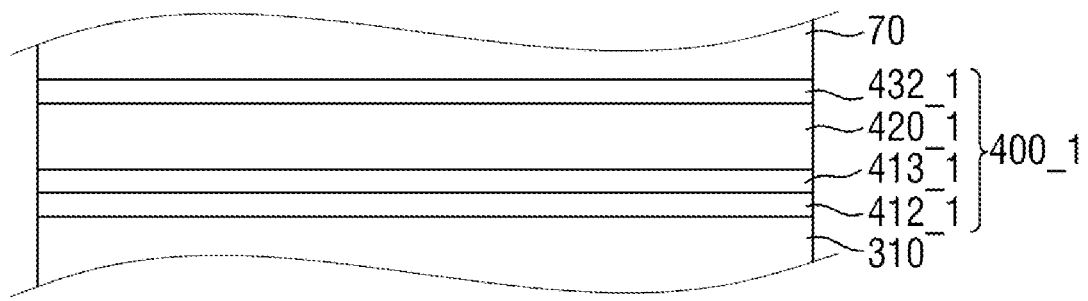
FIG. 10 is a schematic cross-sectional view of a part of an OLED according to a first experimental example.
Figure 10:
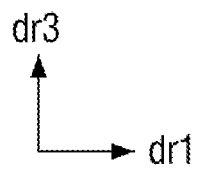
Figure 11:
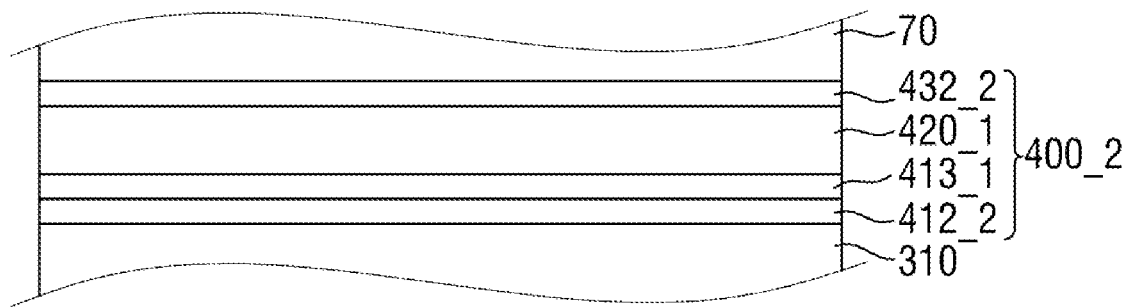
FIG. 11 is a schematic cross-sectional view of a part of an OLED according to a second experimental example.
Figure 11:
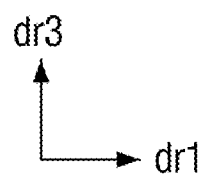
Figure 12:
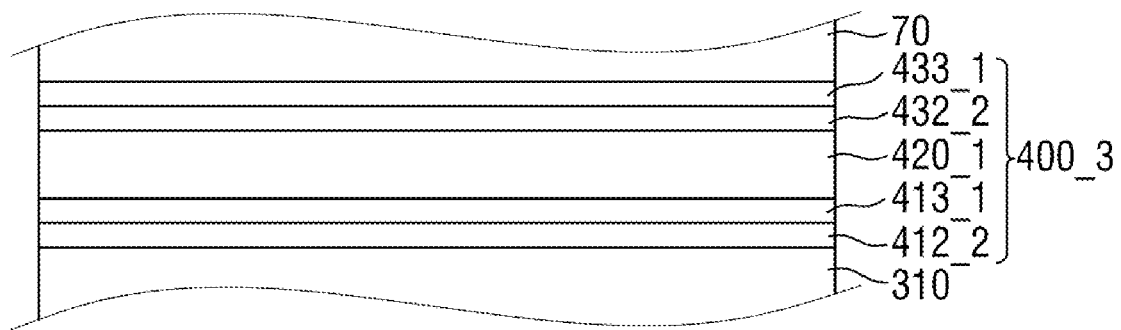
FIG. 12 is a schematic cross-sectional view of a part of an OLED according to a third experimental example.
Figure 13:
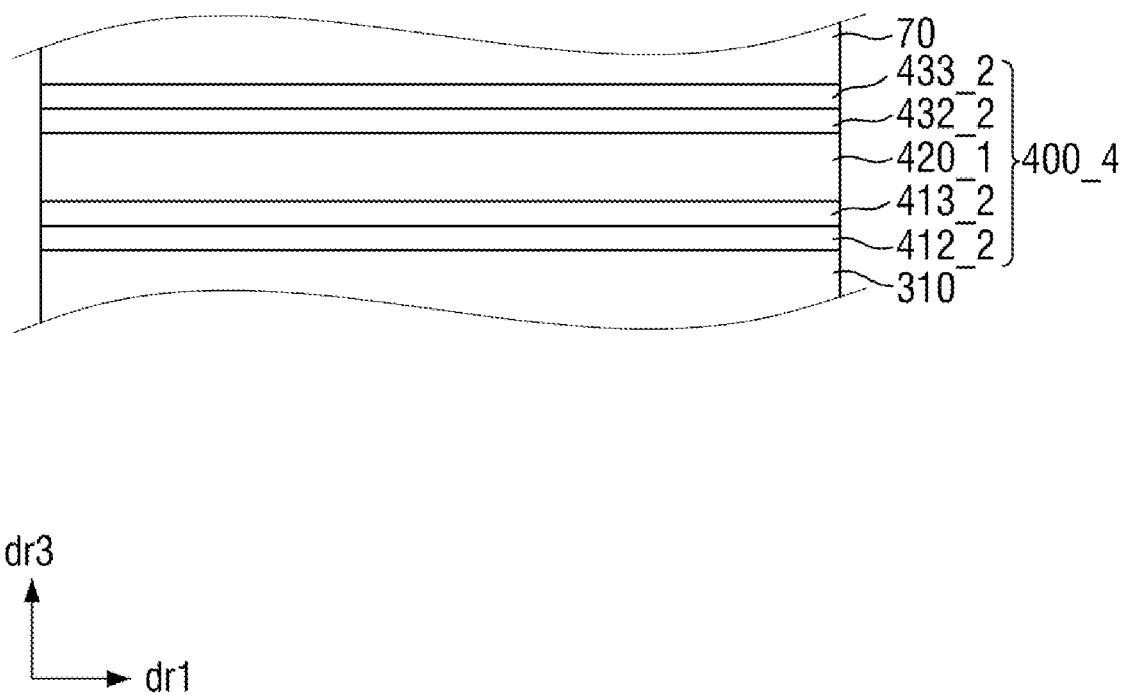
FIG. 13 is a schematic cross-sectional view of a part of an OLED according to a fourth experimental example.
Figure 14:
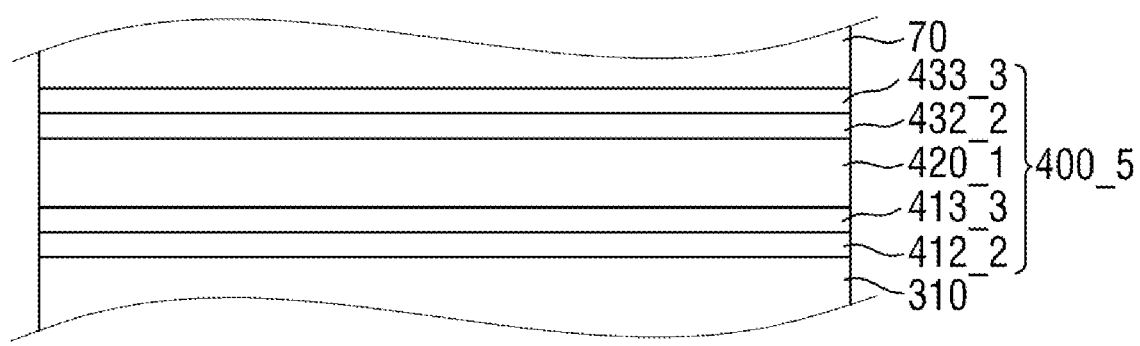
FIG. 14 is a schematic cross-sectional view of a part of an OLED according to a fifth experimental example.
Figure 15:
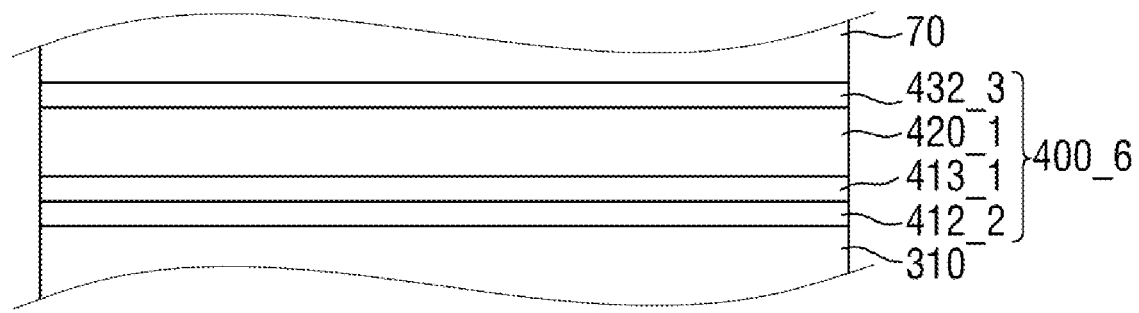
FIG. 15 is a schematic cross-sectional view of a part of an OLED according to a sixth experimental example.

FIG. 10 is a schematic cross-sectional view of a part of an OLED according to a first experimental example. FIG. 11 is a schematic cross-sectional view of a part of an OLED according to a second experimental example. FIG. 12 is a schematic cross-sectional view of a part of an OLED according to a third experimental example. FIG. 13 is a schematic cross-sectional view of a part of an OLED according to a fourth experimental example. FIG. 14 is a schematic cross-sectional view of a part of an OLED according to a fifth experimental example. FIG. 15 is a schematic cross-sectional view of a part of an OLED according to a sixth experimental example.

Referring to FIGS. 10 through 15, the OLEDs according to the experimental examples are different from the OLED 1 of FIG. 4 in the configuration of encapsulation layers 400_1 through 400_6. Here, each of the encapsulation layers 400_1 through 400_6 is interposed between a second interlayer insulating layer 350 (or an organic light emitting diode 310) and a filling layer 70.

The encapsulation layer 400_1 of the first experimental example may have a structure in which a second sub-inorganic layer 412 (e.g., 412_1), a third sub-inorganic layer 413 (e.g., 413_1), an organic layer 420 (e.g., 420_1) and a fifth sub-inorganic layer 432 (e.g., 432_1) are sequentially stacked.

The encapsulation layer 400_2 of the second experimental example may have a structure in which a second sub-inorganic layer 412 (e.g., 412_2), a third sub-inorganic layer 413 (e.g., 413_1), an organic layer 420 (e.g., 420_1) and a fifth sub-inorganic layer 432 (e.g., 432_2) are sequentially stacked.

The encapsulation layer 400_3 of the third experimental example may have a structure in which a second sub-inorganic layer 412 (e.g., 412_2), a third sub-inorganic layer 413 (e.g., 413_1), an organic layer 420 (e.g., 420_1), a fifth sub-inorganic layer 432 (e.g., 432_2) and a sixth sub-inorganic layer 433 (e.g., 433_1) are sequentially stacked.

The encapsulation layer 4004 of the fourth experimental example may have a structure in which a second sub-inorganic layer 412 (e.g., 412_2), a third sub-inorganic layer 413 (e.g., 413_2), an organic layer 420 (e.g., 420_1), a fifth sub-inorganic layer 432 (e.g., 432_2) and a sixth sub-inorganic layer 433 (e.g., 433_2) are sequentially stacked.

The encapsulation layer 400_5 of the fifth experimental example may have a structure in which a second sub-inorganic layer 412 (e.g., 412_2), a third sub-inorganic layer 413 (e.g., 413_3), an organic layer 420 (e.g., 420_1), a fifth sub-inorganic layer 432 (e.g., 432_2) and a sixth sub-inorganic layer 433 (e.g., 433_3) are sequentially stacked.

The encapsulation layer 400_6 of the sixth experimental example may have a structure in which a second sub-inorganic layer 412 (e.g., 412_2), a third sub-inorganic layer 413 (e.g., 413_1), an organic layer 420 (e.g., 420_1) and a fifth sub-inorganic layer 432 (e.g., 432_3) are sequentially stacked. The thickness and refractive index of each element of each of the encapsulation layers 400_1 through 400_6 according to the first through sixth experimental examples are as shown in Table 1 below.

TABLE 1

|  | Stacked structure of encapsulation layer | Thickness [μm] | Refractive index | Front light efficiency |
|---|---|---|---|---|
| First experimental example | Fifth sub-inorganic layer 432_1 | 0.7 | 1.86 | 0.94 |
|  | Organic layer 420_1 | 4 | 1.5 |  |
|  | Third sub-inorganic layer 413_1 | 0.1 | 1.55 |  |
|  | Second sub-inorganic layer 412_1 | 1 | 1.78 |  |
| Second experimental example | Fifth sub-inorganic layer 432_2 | 1.5 | 1.64 | 1 |
|  | Organic layer 420_1 | 4 | 1.5 |  |
|  | Third sub-inorganic layer 413_1 | 0.1 | 1.55 |  |
|  | Second sub-inorganic layer 412_2 | 1.5 | 1.64 |  |
| Third experimental example | Sixth sub-inorganic layer 433_1 | 0.1 | 1.55 | 1.04 |
|  | Fifth sub-inorganic layer 432_2 | 1.5 | 1.64 |  |
|  | Organic layer 420_1 | 4 | 1.5 |  |
|  | Third sub-inorganic layer 413_1 | 0.1 | 1.55 |  |
|  | Second sub-inorganic layer 412_2 | 1.5 | 1.64 |  |
| Fourth experimental example | Sixth sub-inorganic layer 433_2 | 0.05 | 1.55 | 1.01 |
|  | Fifth sub-inorganic layer 432_2 | 1.5 | 1.64 |  |
|  | Organic layer 420_1 | 4 | 1.5 |  |
|  | Third sub-inorganic layer 413_2 | 0.05 | 1.55 |  |
|  | Second sub-inorganic layer 412_2 | 1.5 | 1.64 |  |
| Fifth experimental example | Sixth sub-inorganic layer 433_3 | 0.2 | 1.55 | 0.99 |
|  | Fifth sub-inorganic layer 432_2 | 1.5 | 1.64 |  |
|  | Organic layer 420_1 | 4 | 1.5 |  |
|  | Third sub-inorganic layer 413_3 | 0.2 | 1.55 |  |
|  | Second sub-inorganic layer 412_2 | 1.5 | 1.64 |  |
| Sixth experimental example | Fifth sub-inorganic layer 432_3 | 1.5 | 1.69 | 0.98 |
|  | Organic layer 420_1 | 4 | 1.5 |  |
|  | Third sub-inorganic layer 413_1 | 0.1 | 1.55 |  |
|  | Second sub-inorganic layer 412_2 | 1.5 | 1.69 |  |

The front light efficiency of the OLED of the first experimental example was reduced by about 6% as compared with the front light efficiency of the OLED of the second experimental example. The front light efficiency of the OLED of the third experimental example was increased by about 4% as compared with the front light efficiency of the OLED of the second experimental example. The front light efficiency of the OLED of the fourth experimental example was increased by about 1% as compared with the front light efficiency of the OLED of the second experimental example. The front light efficiency of the OLED of the fifth experimental example was reduced by about 1% as compared with the front light efficiency of the OLED of the second experimental example. The front light efficiency of the OLED of the sixth experimental example was reduced by about 2% as compared with the front light efficiency of the OLED of the second experimental example.

By comparing the first experimental example and the second experimental example, it can be seen that the front light efficiency increases as the difference in refractive index between the second sub-inorganic layer 412 and the third sub-inorganic layer 413 and the difference in refractive index between the organic layer 420 and the fifth sub-inorganic layer 432 decrease. In some embodiments, the difference in refractive index between the second sub-inorganic layer 412 and the third sub-inorganic layer 413 may be 0.09 or less. In addition, in some embodiments, the difference in refractive index between the organic layer 420 and the fifth sub-inorganic layer 432 may be 0.14 or less.

By comparing the second experimental example and the third experimental example, it can be seen that the front light efficiency increases as the difference in interfacial refractive index between the filling layer 70 and the encapsulation layer 400 decreases. Here, because the filling layer 70 is formed of a sparser material than the encapsulation layer 400, the third experimental example has a smaller difference in interfacial refractive index between the filling layer 70 and the sixth sub-inorganic layer 433_1 than the second experimental example, which has a greater difference in interfacial refractive index between the filling layer 70 and the fifth sub-inorganic layer 432_2.

By comparing the third experimental example, the fourth experimental example and the fifth experimental example, it can be seen that, when the interfacial refractive indices are the same, a desirable thickness (e.g., an optimum thickness) of each of the third sub-inorganic layer 413 and the sixth sub-inorganic layer 433 is about 0.1 □. In some embodiments, the thickness of the third sub-inorganic layer 413 and/or the sixth sub-inorganic layer 433 may be about 0.1 □.

Next, OLEDs according to additional embodiments will be described. Same elements as those described in association with FIGS. 1 through 15 are indicated by the same reference numerals and a detailed description thereof will not be repeated.

Figure 16:
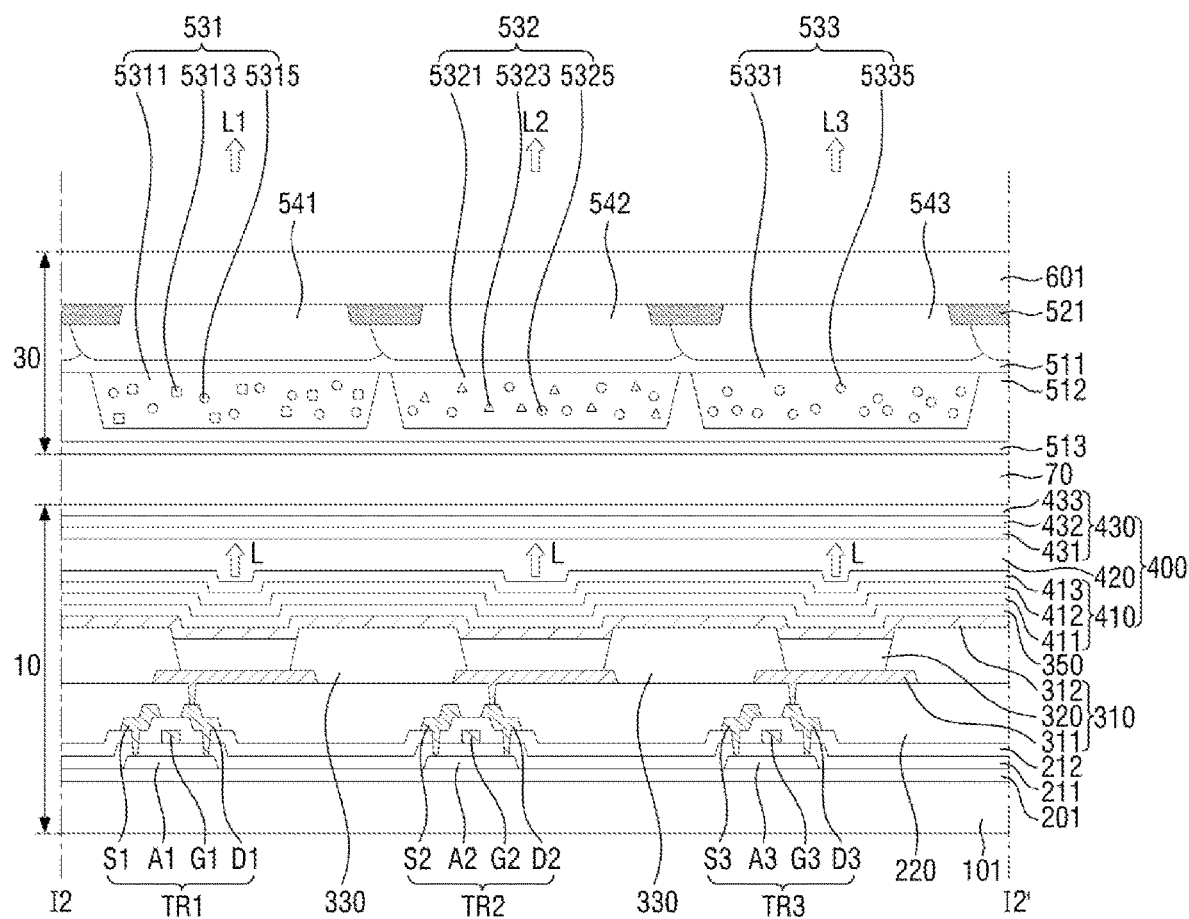
FIG. 16 is a cross-sectional view of an OLED according to an embodiment.

FIG. 16 is a cross-sectional view of an OLED 2 according to an embodiment.

Referring to FIG. 16, the OLED 2 according to the current embodiment is different from the OLED 1 of FIG. 4 in that the second black matrix 522 is omitted.

A second substrate 30 may include second color conversion filters and a light transmission pattern 533 disposed on a first capping layer 511. A second capping layer 512 and a third capping layer 513 may be disposed on the second color conversion filters and the light transmission pattern 533. The second capping layer 512 and the third capping layer 513 may directly contact each other without an element interposed between them.

Figure 17:
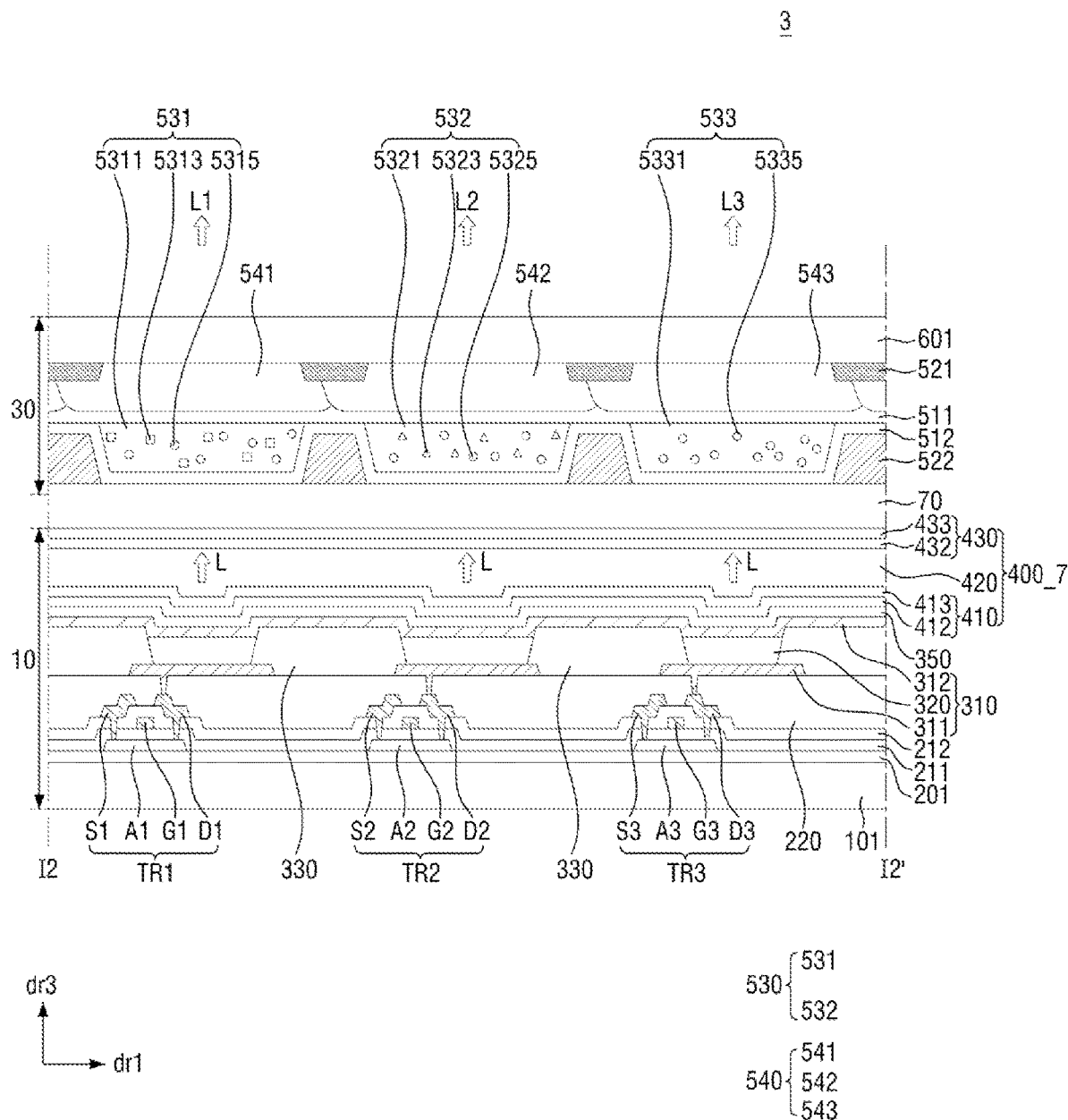
FIG. 17 is a cross-sectional view of an OLED according to an embodiment.

FIG. 17 is a cross-sectional view of an OLED 3 according to an embodiment.

Referring to FIG. 17, the OLED 3 according to the current embodiment is different from the OLED 1 of FIG. 4 in that the first sub-inorganic layer 411 and the fourth sub-inorganic layer 431 of the encapsulation layer 400 and the third capping layer 513 are omitted.

An encapsulation layer 400_7 may include a second sub-inorganic layer 412 disposed on a second interlayer insulating layer 350, a third sub-inorganic layer 413 disposed on the second sub-inorganic layer 412, an organic layer 420 disposed on the third sub-inorganic layer 413, a fifth sub-inorganic layer 432 disposed on the organic layer 420, and a sixth sub-inorganic layer 433 disposed on the fifth sub-inorganic layer 432. The encapsulation layer 400_7 may be relatively thinner than that of the embodiment of FIG. 4. Accordingly, the total thickness of the OLED 3 may be reduced.

A second black matrix 522 may be disposed on a second capping layer 512. A second substrate 30 and a filling layer 70 may contact each other, and parts of the second capping layer 512 of the second substrate 30 and the second black matrix 522 may contact the filling layer 70. The third capping layer 513 may be omitted, unlike in the embodiment of FIG. 4, thereby making the total thickness of the OLED 3 relatively smaller.

Figure 18:
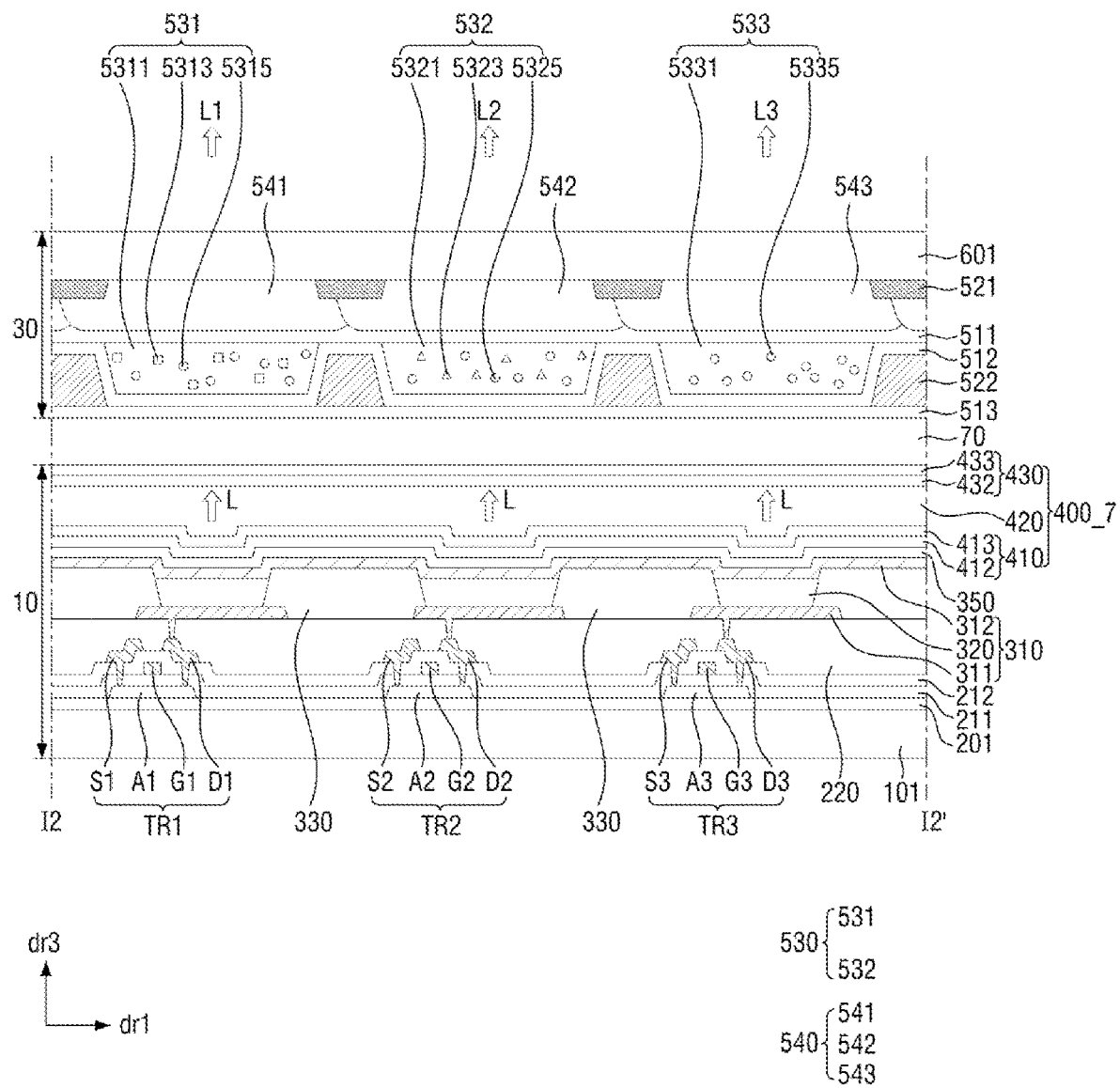
FIG. 18 is a cross-sectional view of an OLED according to an embodiment.

FIG. 18 is a cross-sectional view of an OLED 4 according to an embodiment.

Referring to FIG. 18, the OLED 4 according to the current embodiment is different from the OLED 3 of FIG. 17 in that it further includes a third capping layer 513.

In a second substrate 30, a second black matrix 522 may be disposed on a second capping layer 512, and the third capping layer 513 may be disposed on the second capping layer 512 and the second black matrix 522. The third capping layer 513 of the second substrate 30 may contact a filling layer 70.

According to embodiments, the amount of light extracted at the front can be increased by adjusting the difference in interfacial refractive index between elements of an OLED. Accordingly, the luminance of the OLED can be improved.

In addition, color conversion efficiency can be increased utilizing a color conversion layer of the OLED according to embodiments of the present disclosure.

However, the effects of the embodiments are not restricted to the ones set forth herein. The above and other effects of the embodiments will become more apparent to one of ordinary skill in the art to which the embodiments pertain by referencing the claims, and equivalents thereof.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Although the exemplary embodiments of the present disclosure have been described with reference to the accompanying drawings, it will be understood by those skilled in the art to which the present disclosure pertains that the subject matter of the present disclosure can be carried out in other (e.g., detailed) forms without changing the technical spirits and essential features thereof. Therefore, the above-described exemplary embodiments of the present disclosure are merely exemplary in all aspects and should not be construed to be limiting.

What is claimed is:
1. A display device comprising:
a first base substrate;
a plurality of light emitting diodes on the first base substrate;
a first inorganic layer on the plurality of light emitting diodes;
a second inorganic layer on the first inorganic layer and having a refractive index greater than a refractive index of the first inorganic layer;
an organic layer on the second inorganic layer;
a third inorganic layer on the organic layer; and
a plurality of wavelength conversion patterns on the third inorganic layer,
wherein a thickness of the first inorganic layer is 5000 Å or more, and
wherein the refractive index of the second inorganic layer is 1.5 to 1.57 for light having a wavelength of about 560 nm.

2. The display device of claim 1, wherein a difference between the refractive index of the first inorganic layer and the refractive index of the second inorganic layer is 0.09 or less.

3. The display device of claim 1, wherein a thickness of the second inorganic layer is 3000 Å or less.

4. The display device of claim 1, further comprising an interlayer insulating layer between the plurality of light emitting diodes and the first inorganic layer, wherein the interlayer insulating layer comprises an inorganic material.

5. The display device of claim 4, wherein the interlayer insulating layer has a refractive index of 1.4 to 2.5 and a thickness of 1000 Å or less.

6. The display device of claim 1, wherein the plurality of wavelength conversion patterns comprises quantum dots.

7. The display device of claim 1, further comprising a first capping layer and a second capping layer between the third inorganic layer and the plurality of wavelength conversion patterns, wherein a thickness of each of the first capping layer and the second capping layer is 5000 Å or less.

8. The display device of claim 7, wherein a refractive index of the first capping layer is 1.55 to 1.65, a refractive index of the second capping layer is 1.4 to 2.0, and the second capping layer contacts the plurality of wavelength conversion patterns.

9. The display device of claim 1, further comprising a fourth inorganic layer on the third inorganic layer,
wherein a refractive index of the fourth inorganic layer is greater than a refractive index of the third inorganic layer.

10. The display device of claim 9, wherein the refractive index of the fourth inorganic layer is 1.55 to 1.65 and a thickness of the fourth inorganic layer is 3000 Å or less.

11. The display device of claim 1, further comprising:
a fifth inorganic layer between the plurality of light emitting diodes and the first inorganic layer; and
a sixth inorganic layer between the organic layer and the third inorganic layer.

12. The display device of claim 11, wherein a thickness of each of the fifth inorganic layer and the sixth inorganic layer is 3000 Å or less.

13. The display device of claim 1, wherein each of the plurality of light emitting diodes comprises:
a first electrode on the first base substrate;
a second electrode on the first electrode; and
a plurality of light emitting layers between the first electrode and the second electrode.

14. The display device of claim 1, further comprising:
a third capping layer on the plurality of wavelength conversion patterns; and
a plurality of color filters on the third capping layer.

15. A display device having a plurality of color areas and a non-light emitting area, the display device comprising:
a plurality of light emitting diodes in the plurality of color areas;
a first inorganic layer on the plurality of light emitting diodes;
an organic layer on the first inorganic layer;
a second inorganic layer on the organic layer; and
a wavelength conversion pattern on the second inorganic layer and in at least one color area of the plurality of the color areas,
wherein the first inorganic layer comprises a first sub-inorganic layer and a second sub-inorganic layer having a refractive index greater than a refractive index of the first sub-inorganic layer, and the second inorganic layer comprises a third sub-inorganic layer and a fourth sub-inorganic layer having a refractive index greater than a refractive index of the third sub-inorganic layer,
wherein a thickness of the first sub-inorganic layer is 5000 Å or more, and
wherein the refractive index of the second sub-inorganic layer is 1.5 to 1.57 for light having a wavelength of about 560 nm.

16. The display device of claim 15, wherein the plurality of color areas comprises a first color area, a second color area and a third color area,
wherein the first color area, the second color area and the third color area are to emit light of different colors, and
wherein the plurality of light emitting diodes are in the first color area, the second color area and the third color area, respectively.

17. The display device of claim 16, wherein the plurality of light emitting diodes are to emit light of a same color.

18. The display device of claim 17, wherein the first color area is to output red light, the second color area is to output green light, the third color area is to output blue light, and each of the plurality of light emitting diodes is to emit blue light.

19. The display device of claim 15, further comprising a filling layer between the second inorganic layer and the wavelength conversion pattern.

20. The display device of claim 19, further comprising a first capping layer and a second capping layer between the wavelength conversion pattern and the filling layer, each of the first capping layer and the second capping layer having a refractive index greater than a refractive index of the filling layer.

* * * * *